(12) United States Patent
Funk et al.

(10) Patent No.: US 12,057,293 B2
(45) Date of Patent: Aug. 6, 2024

(54) METHODS FOR REAL-TIME PULSE MEASUREMENT AND PULSE TIMING ADJUSTMENT TO CONTROL PLASMA PROCESS PERFORMANCE

(71) Applicant: Tokyo Electron Limited, Tokyo (JP)

(72) Inventors: Merritt Funk, Austin, TX (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 606 days.

(21) Appl. No.: 17/318,116

(22) Filed: May 12, 2021

(65) Prior Publication Data

US 2022/0367149 A1    Nov. 17, 2022

(51) Int. Cl.
*H05H 1/24* (2006.01)
*H01J 37/32* (2006.01)
*H01L 21/66* (2006.01)
*H01L 21/67* (2006.01)

(52) U.S. Cl.
CPC .. *H01J 37/32146* (2013.01); *H01J 37/32183* (2013.01); *H01L 21/67253* (2013.01); *H01L 22/20* (2013.01); *H01J 2237/334* (2013.01)

(58) Field of Classification Search
CPC ...... H05H 1/24; H01L 21/67253; H01L 22/20
See application file for complete search history.

(56) References Cited

U.S. PATENT DOCUMENTS

| | | | |
|---|---|---|---|
| 5,576,629 A | 11/1996 | Turner et al. | |
| 8,192,576 B2 | 6/2012 | Kuthi et al. | |
| 8,912,835 B2 | 12/2014 | Nagarkatti et al. | |
| 10,510,512 B2 | 12/2019 | Funk et al. | |
| 2002/0115301 A1* | 8/2002 | Savas | H01J 37/321 156/345.48 |

(Continued)

FOREIGN PATENT DOCUMENTS

KR    1020160008367    1/2016

OTHER PUBLICATIONS

Fazelpour, S., et al., "The Effect of Key Parameters on Power Absorption in Helicon Plasma Sources". IEEE Transactions on Plasma Science, vol. 48, No. 7, Jul. 2020, pp. 2337-2350.*

(Continued)

*Primary Examiner* — Bret P Chen
(74) *Attorney, Agent, or Firm* — Egan, Enders & Huston LLP.

(57) ABSTRACT

Various embodiments of systems and methods are described herein for controlling a pulsed plasma. Pulse timing parameters (e.g., the pulse on-time and/or the pulse-off time) of the plasma generation source may be controlled based on the measurement data received from measurement device(s), to control the plasma exposure of the substrate during a sequence of dynamically controlled pulses within the plasma process chamber. In addition or alternatively, pulse timing parameters (e.g., the pulse on-time and/or the pulse-off time) can be applied to the source power, bias power, and/or both based on the measurement data received from measurement device(s), to control a plasma exposure of the substrate. The pulse timing changes may be made in a feedforward or feedback manner.

20 Claims, 9 Drawing Sheets

(56) References Cited

U.S. PATENT DOCUMENTS

| | | | |
|---|---|---|---|
| 2004/0060660 A1* | 4/2004 | Klimecky | H01J 37/321 156/345.44 |
| 2004/0116080 A1 | 6/2004 | Chen et al. | |
| 2004/0200574 A1* | 10/2004 | Davis | G05B 19/41875 156/345.24 |
| 2005/0151544 A1 | 7/2005 | Mahoney et al. | |
| 2006/0088655 A1* | 4/2006 | Collins | C23C 14/48 427/523 |
| 2008/0188013 A1* | 8/2008 | Cho | H01J 37/32935 156/345.24 |
| 2008/0268173 A1* | 10/2008 | White | H01J 37/32495 118/728 |
| 2009/0177410 A1* | 7/2009 | Konishi | H01L 21/67069 702/57 |
| 2010/0148769 A1* | 6/2010 | Choi | G01R 33/12 324/239 |
| 2010/0187091 A1* | 7/2010 | Pierce | B22F 9/20 422/186.04 |
| 2012/0262064 A1 | 10/2012 | Nagarkatti et al. | |
| 2012/0292305 A1* | 11/2012 | Ambal | G05D 23/22 219/520 |
| 2017/0011889 A1 | 1/2017 | Winkler | |
| 2017/0358428 A1 | 12/2017 | Kaweasaki et al. | |
| 2018/0337022 A1 | 11/2018 | Morimoto et al. | |
| 2019/0122903 A1* | 4/2019 | Shim | H01L 21/31116 |
| 2021/0013005 A1 | 1/2021 | Funk et al. | |

OTHER PUBLICATIONS

Zielke, D, et al., "RF power transfer efficiency and plasma parameters of low pressure high power ICPs". J. Phys. D: Appl. Phys. 54 (2021) 155202, pp. 1-9.*

Gerling, Torsten, et al., "Power measurement for an atmospheric pressure plasma jet at different frequencies: distribution in the core plasma and the effluent". Eur. Phys. J. Appl. Phys. (2017) 78:10801, pp. 1-6.*

Gusev, V.K., et al., "Plasma jet source parameter optimisation and experiments on injection into Globus-M spherical tokamak". 8 pages. Citation information unavailable.*

Blanken, T.C., et al., "Real-time plasma state monitoring and supervisory control on TCV". Nucl. Fusion 59 (2019) 026017 pp. 1-17.*

Chang, Yuan-Jen, et al., "Real-time laser-induced plasma monitoring in percussion pulsed laser material processing". Measurement 135 (2019) 905-912.*

Moses et al., "RF Voltage And Current (V-1) Sensors And Measurement Methods", U.S. Appl. No. 16/913,545, filed Jun. 26, 2020, 66 pgs.

Moses et al., "RF Voltage And Current (V-1) Sensors And Measurement Methods", U.S. Appl. No. 16/913,526, filed Jun. 26, 2020, 63 pgs.

Search Report and The Written Opinion mailed Aug. 9, 2022, Application No. PCT/US2022/025402, Filed Apr. 19, 2022, 12 pgs.

* cited by examiner

METHODS FOR REAL-TIME PULSE MEASUREMENT AND PULSE TIMING ADJUSTMENT TO CONTROL PLASMA PROCESS PERFORMANCE

BACKGROUND

The present disclosure relates to the processing of substrates in plasma process apparatus. In particular, it provides systems and methods to monitor and adjust the pulse timing of plasmas generated in a plasma processing apparatus.

The use of plasma systems for the processing of substrates (such as semiconductor wafers) is well known. Plasma processing systems are often utilized in plasma etching and/or plasma deposition processes. For example, plasma processing systems may be used for etching substrates to form microelectronic or micromechanical devices. Plasma processing systems generate plasma by supplying high frequency electrical power to gas mixtures in a plasma process chamber to ionize the gases in the plasma process chamber. Conventional hardware and processing techniques may result in non-uniform distribution of ions or plasma density across the substrate. Furthermore, conventional systems may not provide sufficient plasma density under certain processing conditions and/or with certain plasma gases.

Plasma processing presents numerous technical challenges, and as geometries for structures and layers on substrates continue to shrink, control of the plasma becomes increasingly important. Performance of plasma processes is impacted by a number of variables including plasma species, plasma density, kinetic energy of ions, reactive neutrals, etc. Variable settings of the plasma processing equipment can be adjusted to change plasma properties and achieve a desired process performance. These settings include, but are not limited to gas flow rates, gas pressure, electrical power for the plasma excitation, bias voltages, etc., all as is known in the art. Since these settings are not directly related to the plasma properties, controllability of the plasma properties to achieve a desired process performance is often challenging. As the requirements of substrate processing are becoming more and more challenging, better controllability of the plasma properties is needed.

Plasma control optimization is performed throughout a sequence of dynamically controlled process steps, and method of control is a factor in maintaining plasma distribution uniformity, profile control and plasma density profiles while the substrate surface is constantly changing. Conventional hardware and processing techniques do not provide sufficient mechanisms for responsive control of plasma during the etch or deposition process sequence. The problem with fixed plasma parameter setting may be exacerbated with use of certain etch gas chemistries, in certain system architectures, or in certain applications. Prior systems are ill-equipped for providing consistently stable and optimal plasma fields in such circumstances. Consequently, product quality and throughput may be compromised.

SUMMARY

Various embodiments of systems and methods are described herein for controlling a pulsed plasma. Pulse timing parameters (e.g., the pulse on-time and/or the pulse-off time) of the plasma generation source may be controlled based on the measurement data received from measurement device(s), to control the plasma exposure of the substrate during a sequence of dynamically controlled pulses within the plasma process chamber. In addition or alternatively, pulse timing parameters (e.g., the pulse on-time and/or the pulse-off time) can be applied to the source power, bias power, and/or both based on the measurement data received from measurement device(s), to control a plasma exposure of the substrate. The pulse timing changes may be made in a feedforward or feedback manner.

According to one embodiment, a method is provided herein for controlling plasma performance in a system for treating a substrate, wherein the system includes one or more power sources. In general, the method may include supplying a first power signal from the one or more power sources to a plasma process chamber to generate a plasma within the plasma process chamber for treating the substrate with a pulsed plasma process, and supplying a second power signal from the one or more power sources to the plasma process chamber. The first power signal may include a first set of timing parameters that specify a pulse on-time and a pulse off-time for the first power signal. Likewise, the second power signal may include a second set of timing parameters that specify a pulse on-time and a pulse off-time for the second power signal. In addition, the method may include generating measurement data corresponding to the first power signal, the second power signal, the plasma and/or a chamber pressure, wherein the measurement data is generated in real-time as the pulsed plasma process is performed. Furthermore, the method may include adjusting, in response to the measurement data, one or more timing parameters of the first power signal, one or more timing parameters of the second power signal and/or the chamber pressure to modify a pulse width of the first power signal and/or a pulse width of the second power signal to control one or more properties of the plasma during the plasma process.

In some embodiments, said supplying the first power signal and said supplying the second power signal may include supplying the first power signal and the second power signal from a single power source. In other embodiments, said supplying the first power signal may include supplying the first power signal from a first power source, and said supplying the second power signal may include supplying the second power signal from a second power source distinct from the first power source.

In some embodiments, said generating measurement data may include generating in-situ measurement data. For example, said generating measurement data may include measuring one or more of: an optical intensity or an optical emission spectra of the plasma generated within the plasma process chamber; and/or a direct current voltage (Vdc) level of the plasma generated within the plasma process chamber.

In some embodiments, said generating measurement data may include generating ex-situ measurement data. For example, said generating measurement data may include measuring one or more of: a power, a voltage, a current and/or a phase of the first power signal; a power, a voltage, a current and/or a phase of the second power signal; and a power, a voltage, a current and/or a phase of at least one harmonic of the first power signal and/or the second power signal. In some embodiments, said generating measurement data may include measuring a fundamental frequency power level and a voltage, a current and a phase of up to five harmonics of the first power source and the second power source. The measurement data generated in such embodiments can be selectively used individually, or in combinations.

The one or more properties of the plasma that are controlled during said adjusting one or more timing parameters may include, but are not limited to, a plasma density, an electron temperature, a gas dissociation, an etch material selectivity, an ion flux and/or an ion energy of the plasma.

In some embodiments, the first power signal may be a source power signal, and said adjusting may include adjusting the pulse on-time of the first power signal to control a plasma density of the plasma. In one example embodiment, said adjusting may include adjusting the pulse on-time of the first power signal in real-time during a cycle of the pulsed plasma process based on the measurement data generated during the cycle. For example, said generating measurement data may include detecting a rising edge of the first power signal during a cycle of the pulsed plasma process, and said adjusting may include adjusting a falling edge of the first power signal during the cycle of the pulsed plasma process to control the pulse on-time of the first power signal, so as to maintain a specified plasma density.

In some embodiments, the second power signal may be a bias power signal, and said adjusting may include adjusting the pulse on-time of the second power signal to control an ion flux and/or an ion energy of the plasma. In one example embodiment, said adjusting may include adjusting the pulse on-time of the second power signal in real-time during a cycle of the pulsed plasma process based on the measurement data generated during the cycle. For example, said generating measurement data may include detecting a rising edge of the second power signal during each cycle of the pulsed plasma process, and said adjusting may include adjusting a falling edge of the second power signal during each cycle of the pulsed plasma process to control the pulse on-time of the second power signal, so as to maintain a specified ion flux and/or ion energy.

In some embodiments, if the pulse on-time of the second power signal is adjusted during a current cycle of the pulsed plasma process, said adjusting may further include adjusting the pulse on-time and the pulse off-time of the second power signal in the next cycle of the pulsed plasma process based on the adjustment made during the current cycle.

In some embodiments, said adjusting may be performed to control a relative timing between the first power signal and the second power signal. For example, said adjusting may be performed to control a time between the pulse off-time of the first power signal and the pulse on-time of the second power signal.

In some embodiments, said generating measurement data may include using a single measurement device to measure pulses in the plasma from multiple plasma pulsing feeds supplied to the plasma process chamber.

In some embodiments, said generating measurement data may include measuring an optical emission spectra of the plasma while measuring: (a) a power, a voltage or a current of the first power signal, (b) a power, a voltage or a current of the second power signal and/or (c) a power, a voltage or a current of a harmonic of the first power signal or the second power signal. In such embodiments, the method may further include comparing the optical emission spectra of the plasma to: (a) the power, the voltage or the current of the first power signal, (b) the power, the voltage or the current of the second power signal, or (c) the power, the voltage or the current of the harmonic of the first power signal or the second power signal.

In some embodiments, wherein said generating measurement data may include measuring the chamber pressure within the plasma process chamber. In such embodiments, said adjusting may include adjusting the chamber pressure during the plasma process to control the one or more properties of the plasma.

According to another embodiment, a system is provided herein for treating a substrate. The system may generally include a plasma process chamber, one or more power sources, one or more measurement devices and a controller. The plasma process chamber may be generally configured to treat the substrate with a pulsed plasma process. The one or more power sources may be coupled to supply a first power signal and a second power signal to the plasma process chamber to generate a plasma within the plasma process chamber. As noted above, the first power signal may include a first set of timing parameters that specify a pulse on-time and a pulse off-time for the first power signal, and the second power signal may include a second set of timing parameters that specify a pulse on-time and a pulse off-time for the second power signal. In some embodiments, the first power signal and the second power signal may be supplied from a single power source. In other embodiments, the first power signal may be supplied from a first power source and the second power signal may be supplied from a second power source distinct from the first power source.

The one or more measurement devices may be configured to generate measurement data corresponding to the first power signal, the second power signal, the plasma or a chamber pressure, and the measurement data may be generated in real-time as the pulsed plasma process is performed within the plasma process chamber. In some embodiments, the measurement data generated by the one or more measurement devices may include one or more of: (a) a power, voltage, current and/or phase of the first power signal; (b) a power, a voltage or a current of a harmonic of the first power signal; (c) a power, voltage, current and/or phase of the second power signal; (d) a power, a voltage or a current of a harmonic of the second power signal; (e) an optical intensity or an optical emission spectra of the plasma generated within the plasma process chamber; (f) a direct current voltage (Vdc) level of the plasma generated within the plasma process chamber; and (g) the chamber pressure within the plasma process chamber.

The controller may be coupled to the one or more power sources and to the one or more measurement devices. In response to the measurement data, the controller may be configured to adjust one or more timing parameters of the first power signal, the second power signal and/or the chamber pressure to modify a pulse width of the first power signal and/or a pulse width of the second power signal to control one or more plasma properties during the plasma process.

In some embodiments, the first power signal may be a source power signal, and the controller may be configured to adjust the pulse on-time of the first power signal to control a plasma density of the plasma. In one example embodiment, the controller may be configured to adjust the pulse on-time of the first power signal in real-time during a cycle of the pulsed plasma process based on the measurement data generated by the one or more measurement devices during the cycle. For example, the one or more measurement devices may be configured to detect a rising edge of the first power signal during the cycle of the pulsed plasma process. Based on the rising edge of the first power signal detected by the one or more measurement devices, the controller may be configured to adjust a falling edge of the first power signal during the cycle of the pulsed plasma process to control the pulse on-time of the first power signal, so as to maintain a specified plasma density.

In some embodiments, the second power signal may be a bias power signal, and the controller may be configured to adjust the pulse on-time of the second power signal to control an ion flux and/or an ion energy of the plasma. In one example embodiment, the controller may be configured to adjust the pulse on-time of the second power signal in real-time during a cycle of the pulsed plasma process based on the measurement data generated during the cycle. For example, the one or more measurement devices may be configured to detect a rising edge of the second power signal during the cycle of the pulsed plasma process. Based on the rising edge of the second power signal detected by the one or more measurement devices, the controller may be configured to adjust a falling edge of the second power signal during the cycle of the pulsed plasma process to control the pulse on-time of the second power signal, so as to maintain a specified ion flux and/or ion energy.

In some embodiments, if the pulse on-time of the second power signal is adjusted during a current cycle of the pulsed plasma process, the controller may be further configured to adjust the pulse on-time and the pulse off-time of the second power signal in the next cycle of the pulsed plasma process based on the adjustment made during the current cycle.

In some embodiments, the one or more measurement devices may be configured to measure the chamber pressure within the plasma process chamber during the pulsed plasma process, and the controller may be configured to adjust the chamber pressure during the pulsed plasma process to maintain a specified plasma density, ion flux and/or ion energy.

According to yet another embodiment, another system is provided for treating a substrate, wherein the system includes a plasma process chamber, a first power source, a second power source, one or more measurement devices and a controller. The plasma process chamber may generally be configured to treat the substrate with a pulsed plasma process, and may include a first power delivery system and a second power delivery system. The first power source may be coupled to supply a first power signal to the first power delivery system to generate a plasma within the plasma process chamber, and the second power source may be coupled to supply a second power signal to the second power delivery system. As noted above, the first power signal may include a first set of timing parameters that specify a pulse on-time and a pulse off-time for the first power signal, and the second power signal may include a second set of timing parameters that specify a pulse on-time and a pulse off-time for the second power signal.

The one or more measurement devices may be configured to generate measurement data in real-time as the pulsed plasma process is performed within the plasma process chamber. In some embodiments, the measurement data may include: (a) ex-situ measurement data corresponding to the first power signal and/or the second power signal, and (b) in-situ measurement data corresponding to the plasma or a chamber pressure within the plasma process chamber. For example, the ex-situ measurement data may include one or more of the following: a power, voltage, current and/or phase of the first power signal; a power, a voltage or a current of a harmonic of the first power signal; a power, voltage, current and/or phase of the second power signal; and a power, a voltage or a current of a harmonic of the second power signal. Likewise, the in-situ measurement data may include one or more of the following: an optical intensity or an optical emission spectra of the plasma generated within the plasma process chamber, a direct current voltage (Vdc) level of the plasma generated within the plasma process chamber and the chamber pressure within the plasma process chamber.

The controller may be coupled to the first power source, the second power source and the one or more measurement devices. In response to the measurement data, the controller may be configured to adjust one or more timing parameters of the first power signal, one or more timing parameters of the second power signal and/or the chamber pressure to modify a pulse width of the first power signal and/or a pulse width of the second power signal to control one or more plasma properties during the plasma process.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
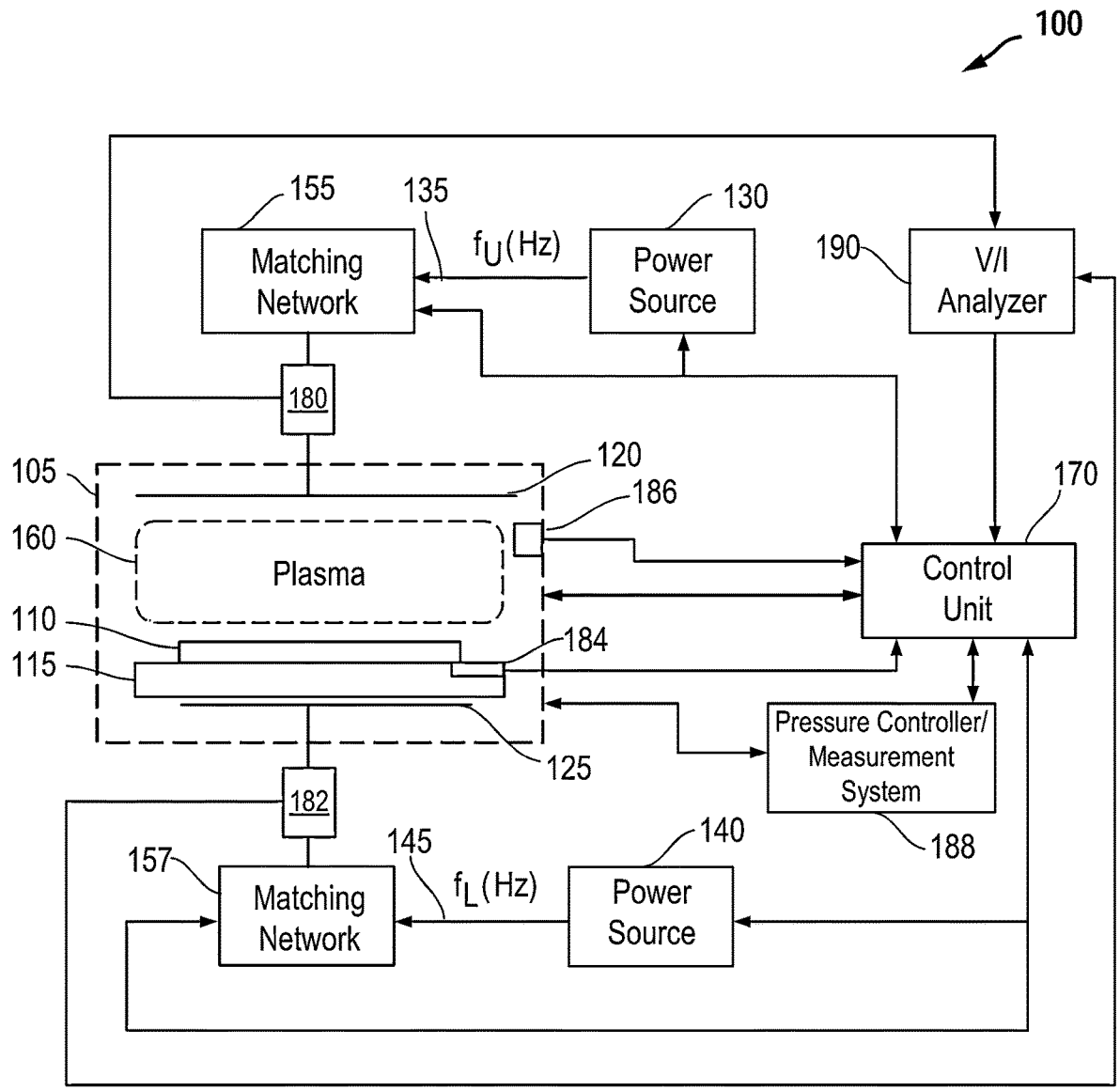
FIG. 1 is a block diagram illustrating an exemplary plasma processing system.

Various embodiments of systems and methods are provided herein to control plasma process performance in a plasma processing system. A system in accordance with the present disclosure may include one or more power sources to generate one or more power signals. In some embodiments, one power source may be used to generate one or more power signals. In other embodiments, two or more power sources may be used to generate two or more power signals. In one exemplary embodiment, the system may include a first power source coupled to supply a first power signal to a plasma process chamber to generate a plasma within the plasma process chamber, and a second power source coupled to supply a second power signal to the plasma process chamber. The system may also contain one or more measurement devices coupled to generate measurement data corresponding to the first power signal, the second power signal or the plasma, and a controller coupled to utilize the measurement data generated by the measurement device(s) to control various properties of the plasma generated within the plasma process chamber. The measurement data may be generated by the measurement device(s) and provided to the controller in real-time, as a plasma process is being performed within the plasma process chamber. By utilizing real-time data, the controller may be configured to adjust one or more parameters of the first power source and/or the second power source in real-time to control the performance of the plasma process.

In some embodiments, the first power source and the second power source may be configured to generate power signals using a set of parameters (e.g., amplitude, frequency, phase, pulse on-time, pulse off-time, etc.), which can be varied according to system requirements and plasma performance. In one embodiment, the first power source may be configured to supply source power at a first set of parameters, and the second power source may be configured to supply bias power at a second set of parameters, to the plasma process chamber. The first set of parameters and the second set of parameters may be specified in a power recipe stored within the controller.

In other embodiments, the first power source may be configured to generate a plurality of power signals using a set of parameters (e.g., amplitude, frequency, phase, pulse on-time, pulse off-time, etc.), which can be varied according to system requirements and plasma performance. In one embodiment, the first power source may be configured to supply source power at a first set of parameters and bias power at a second set of parameters, to the plasma process chamber. The first set of parameters and the second set of parameters may be specified in a power recipe stored within the controller.

In preferred embodiments, the controller may adjust one or more timing parameters (e.g., the pulse on-time and/or the pulse-off time) of the source power, based on the measurement data received from the measurement device(s), to control a plasma density of the plasma generated within the plasma process chamber. In addition or alternatively, the controller may adjust one or more timing parameters (e.g., the pulse on-time and/or the pulse-off time) of the bias power, based on the measurement data received from the measurement device(s), to control an ion flux and/or an ion energy of the generated plasma. Other parameters (e.g., amplitude, frequency, phase, etc.) of the source power and/or the bias power may also be adjusted by the controller based on the measurement data to control various properties of the generated plasma.

In one embodiment, in a multiphase pulse pattern for a pulsed plasma system, the power pulse shape and phase relationship between two pulses may be controlled. The two pulses may be supplied from one power delivery system, or from more than one power delivery system, such as a source power source and a bias power source. The pulse shape and phase changes may include modifying the pulse on-time and/or the pulse-off time. The changes may be performed in a feedforward real-time adjustment based on data from system measurement devices which provide real-time information regarding the plasma and process operation. In some embodiments, feedback control may be utilized so that the pulse shape and phase changes are provided to control subsequent pulses. In yet other embodiments, both feedforward and feedback control may be provided together. The pulse shape and changes may further include amplitude changes. Through the changes of the pulse shape, the plasma exposure of the substrate during a sequence of dynamically controlled pulses will maintain and/or modify the plasmas density, total ion flux and energy throughout a sequence of pulses. Thus, real-time pulse timing control with the ability to automatically adjust the parameters during the etch process may be achieved. Such techniques may compensate for a wide variety of effects such as substrate loading effects during a etch step, chamber condition variability, substrate to substrate, electrical variability of the power systems, gas flow variability, etc.

The techniques described herein may be utilized within a wide range of plasma processing systems. For example, the techniques may be utilized within plasma etch process systems, plasma deposition process systems or any other plasma process system.

FIG. 1 provides one example embodiment of a plasma processing system 100 that can be used with respect to the disclosed techniques and is provided for illustrative purposes only. Although the plasma processing system 100 shown in FIG. 1 is a capacitively coupled plasma (CCP) processing system, one skilled in the art would recognize the techniques described herein could be performed in an inductively coupled plasma (ICP) processing system, a microwave plasma processing system, a Radial Line Slot Antenna (RLSA™) microwave plasma processing system, an electron cyclotron resonance (ECR) plasma processing system, or other type of processing system or combination of systems. For example, a plasma processing system having only a single power source may be used. Thus, it will be recognized by those skilled in the art that the techniques described herein may be utilized with any of a wide variety of plasma processing systems. The plasma processing system 100 shown in FIG. 1 can also be used for a wide variety of operations including, but not limited to, etching, deposition, cleaning, plasma polymerization, plasma-enhanced chemical vapor deposition (PECVD), atomic layer deposition (ALD) and so forth.

Looking in more detail to FIG. 1, the plasma processing system 100 includes a plasma process chamber 105 for treating a substrate 110 with a plasma process. The plasma process chamber 105 may be a pressure controlled chamber as is known in the art. The substrate 110 (e.g., a semiconductor wafer) may be held on a stage or chuck 115 disposed within the plasma process chamber 105. In some embodiments, the substrate 110 may be surrounded by a focus ring (not shown). The use of focus rings in plasma processing is well known. For example, if the substrate 110 is a wafer, a focus ring is typically an annular structure surrounding the wafer. The focus ring serves to confine a plasma (such as plasma 160), ameliorating discontinuity in a bias potential on a surface of the wafer due to fringing effects, and helps provide a uniform and satisfactory plasma process at a peripheral portion of the wafer.

An upper electrode 120 and a lower electrode 125 may also be provided with the plasma process chamber 105, as shown in FIG. 1. It will be recognized that, although drawn as separate components, the lower electrode 125 and the chuck 115 may be formed as one integrated unit. It will be further recognized that, although drawn as a single component, the upper electrode 120 may be implemented as a power delivery system comprising multiple power coupling elements (e.g., multiple antennas). As such, the term "electrode" shall be used herein to refer to a single coupling element or a power delivery system comprising multiple power coupling elements. Further, though not shown, it will be recognized that various gas injection system mechanisms may also be provided to supply processing gases to the plasma process chamber 105, such as for example a gas shower head and the like.

In the embodiment shown in FIG. 1, the upper electrode 120 is electrically coupled to a first power source 130 through a first matching network 155, and the lower electrode 125 is electrically coupled to a second power source 140 through a second matching network 157. In some embodiments, the first power source 130 may provide a source voltage 135 at an upper frequency ($f_U$) to the first matching network 155, and the second power source 140 may provide a bias voltage 145 at a lower frequency ($f_L$) to the second matching network 157. In some embodiments, a voltage (not shown) may also be applied to the chuck 115.

In some embodiments, the first matching network 155 and the second matching network 157 may improve the transfer of power from the first and second power sources to the plasma 160 generated within plasma process chamber 105 by reducing the reflected power. Matching network topologies (e.g. L-type, π-type, T-type, etc.) and automatic control methods are well known to those skilled in the art. In some embodiments, the first and second power sources may be radio frequency (RF) power sources. When implemented as RF sources, the first and second power sources can be configured to supply RF power at one or more frequencies to the upper and lower electrodes. The first and second power sources may be implemented as continuous wave sources or pulsed sources, as is known in the art.

Components of the plasma processing system 100 shown in FIG. 1 can be connected to, and controlled by, a control unit 170 which in turn can be connected to a corresponding memory storage unit (not shown) and user interface (not shown). Various plasma processing operations can be executed via the user interface, and various plasma processing recipes and operations can be stored in the memory storage unit. Accordingly, a given substrate can be processed within the plasma process chamber 105 with various microfabrication techniques. It will be recognized that the control unit 170 may be coupled to receive inputs from, and provide outputs to, various components of the plasma processing system 100. For example, the control unit 170 may be coupled to components within the plasma process chamber 105, the first power source 130, the second power source 140, the first matching network 155, and the second matching network 157. The control unit 170 may also be coupled to various sensors and measurement devices, which may be included within the plasma processing system 100.

The control unit 170 can be implemented in a wide variety of manners. In one example, the control unit 170 may be a computer. In another example, the control unit may include one or more programmable integrated circuits, which are programmed to provide the functionality described herein. For example, one or more processors (e.g., a microprocessor, microcontroller, central processing unit, etc.), programmable logic devices (e.g., a complex programmable logic device (CPLD), field programmable gate array (FPGA), etc.), and/or other programmable integrated circuits can be programmed with software or other programming instructions to implement the functionality of a plasma process recipe. It is further noted that the software or other programming instructions can be stored in one or more non-transitory computer-readable mediums (e.g., memory storage devices, Flash memory, dynamic random access memory (DRAM), reprogrammable storage devices, hard drives, floppy disks, DVDs, CD-ROMs, etc.), and can be executed by the programmable integrated circuits to cause the programmable integrated circuits to perform the processes, functions, and/or capabilities described herein. Other variations could also be implemented.

In operation, the plasma processing system 100 generates a plasma 160 in the plasma process chamber 105 by applying power from the first RF power source 130 and the second RF power source 140 to the upper and lower electrodes, respectively. In some cases, an edge source (not shown) may also be used to apply power to the body of the plasma process chamber 105. The application of power generates a high-frequency electric field between the upper electrode 120 and the lower electrode 125, which dissociates and converts process gas(es) delivered to the plasma process chamber 105 into the plasma 160. The generated plasma 160 can be used to process a target substrate (such as substrate 110 or any material to be processed) in various types of treatments such as, but not limited to, plasma etching, deposition and/or sputtering.

In the example plasma processing system 100 shown in FIG. 1, two RF power sources are used to generate the high-frequency electric field within the plasma process chamber 105. In some embodiments, the first RF power source 130 may provide source power at relatively high frequencies ($f_U$) to convert the process gas(es) delivered to the plasma process chamber 105 into the plasma 160 and to control the plasma density, while the second RF power source 140 provides bias power to control the ion flux and ion energy of the generated plasma. As known in the art, the source power and the bias power may each be applied continuously to generate continuous wave (CW) plasmas, or may be pulsed to generate pulsed plasmas within the plasma process chamber 105. Pulsed plasmas can be generated by modulating the source power and/or the bias power in time, amplitude and/or phase.

In some embodiments, a pulsed plasma process may be conducted within the plasma process chamber 105 by pulsing the source voltage 135 supplied to the upper electrode 120 and the bias voltage 145 supplied to the lower electrode 125. For example, the control unit 170 (or another pulsed signal controller) may pulse the source voltage 135 output from the first RF power source 130 and/or the bias voltage 145 output from the second RF power source 140 between an off-state and an on-state at a desired pulse frequency and duty ratio. By modulating the source voltage 135 and/or the bias voltage 145 (i.e., varying the pulse frequency and/or duty ratio), it is possible to obtain markedly different plasma properties from those produced in continuous wave (CW) plasmas. For example, RF power modulation of the source voltage 135 can be used to provide control over time-averaged plasma density. Likewise, RF power modulation of the bias voltage 145 can be used to provide control over time-averaged ion flux and ion energy.

In one example implementation, the first RF power source 130 may be configured to provide about 0 to 3000 W of source power in a high-frequency range from about 3 MHz to 150 MHz (or above) to the upper electrode 120, and the second RF power source 140 may be configured to provide about 0 to 1400 W of bias power in a low-frequency (LF) range from about 0.2 MHz to 60 MHz to the lower electrode 125. In some embodiments, the source power provided by the first RF power source 130 may be a pulsed RF power signal having a duty ratio between 0% and 100%, and the bias power provided by the second RF power source 140 may be a pulsed RF power signal having a duty ratio between 0% and 100%. The first RF power source 10 and the second RF power source 140 can operate as continuous wave (CW) or pulsed power sources. The source and bias sources can also pulse at multiple levels of power, with varying duty cycles. Different operational ranges can also be used depending on the type of plasma processing system and the type of treatments (e.g., etching, deposition, sputtering, etc.) performed therein.

In some embodiments, one or more measurement devices (such as sensors or metrology devices) may be coupled to the plasma process chamber 105 to collect real-time data, which can be utilized by the control unit 170 to control various plasma properties (e.g., plasma density, ion flux, ion energy, electron temperature (Te), radical concentrations and ratios of gasses, etc.) by adjusting one or more parameters of the power signal(s) provided by the RF power source(s). Example parameters that may be adjusted include, for example, the amplitude, frequency, phase, pulse on-time (i.e., pulse width), multi-level pulse between power levels and duration and pulse off-time of the source/bias power signal. In some embodiments, the time between the source and bias power signals may be another parameter that can be adjusted to control properties of the plasma. For example, a pulse on-time and/or a pulse off-time of the source power signal and/or the bias power signal may be adjusted relative to one another. In one example embodiment, a time between an off-time of the source power signal and an on-time of the bias power signal may be precisely controlled to control the ignition of the bias after the source is turned off or lowered. If the bias does not ignite predictably and repeatably the ion dose extracted by the bias will change.

A variety of measurement devices may be utilized to collect real-time data from the plasma process chamber 105 and/or the signal transmission path between the RF power sources 130/140 and the plasma process chamber 105. Examples of measurement devices include, but are not limited, a power sampling sensor, a three-point sensor, an electromagnetic (EM) sensor, an optical sensor, a voltage/current sensor (V-I sensor), a direct current voltage (Vdc) sensor, and the like. It is recognized that other measurement devices may additionally or alternatively be used to collect real-time data, which may be used by the control unit 170 to control various properties of the plasma 160.

In some embodiments, for example, a first V-I sensor 180 and a second V-I sensor 182 may be coupled to the plasma process chamber 105 to sense the current (I) and/or the voltage (V) of the power signals supplied to the upper and lower electrodes. In the example plasma processing system 100 shown in FIG. 1, the first V-I sensor 180 is coupled between the first matching network 155 and the upper electrode 120 for sensing the current and/or the voltage of the source power supplied to the upper electrode 120. The second V-I sensor 182 is coupled between the second matching network 157 and the lower electrode 125 for sensing the current and/or the voltage of the bias power supplied to the lower electrode 125.

In some embodiments, the first V-I sensor 180 and the second V-I sensor 182 may each be included within a separate power delivery system, and may be used for measuring the current and/or the voltage of the power signal propagating there through. For example, the first V-I sensor 180 may be included within a first power delivery system, which is coupled between the first matching network 155 and the plasma process chamber 105. The first V-I sensor 180 may be used for measuring the current and/or the voltage of the power signal (e.g., source power) propagating through the first power delivery system. In some embodiments, the first V-I sensor 180 can include multiple V-I sensors in the same power delivery system. Likewise, the second V-I sensor 182 may be included within a second power delivery system, which is coupled between the second matching network 157 and the plasma process chamber 105. The second V-I sensor 182 may be used for measuring the current and/or the voltage of the power signal (e.g., bias power) propagating through the second power delivery system. Example embodiments of V-I sensors are described in U.S. patent application Ser. No. 16/913,526 entitled "RF Voltage and Current (V-I) Sensors and Measurement Methods," filed Jun. 26, 2020, and U.S. patent application Ser. No. 16/913,545 entitled "RF Voltage and Current (V-I) Sensors and Measurement Methods," filed Jun. 26, 2020, each of which is expressly incorporated herein in its entirety.

Figure 5:
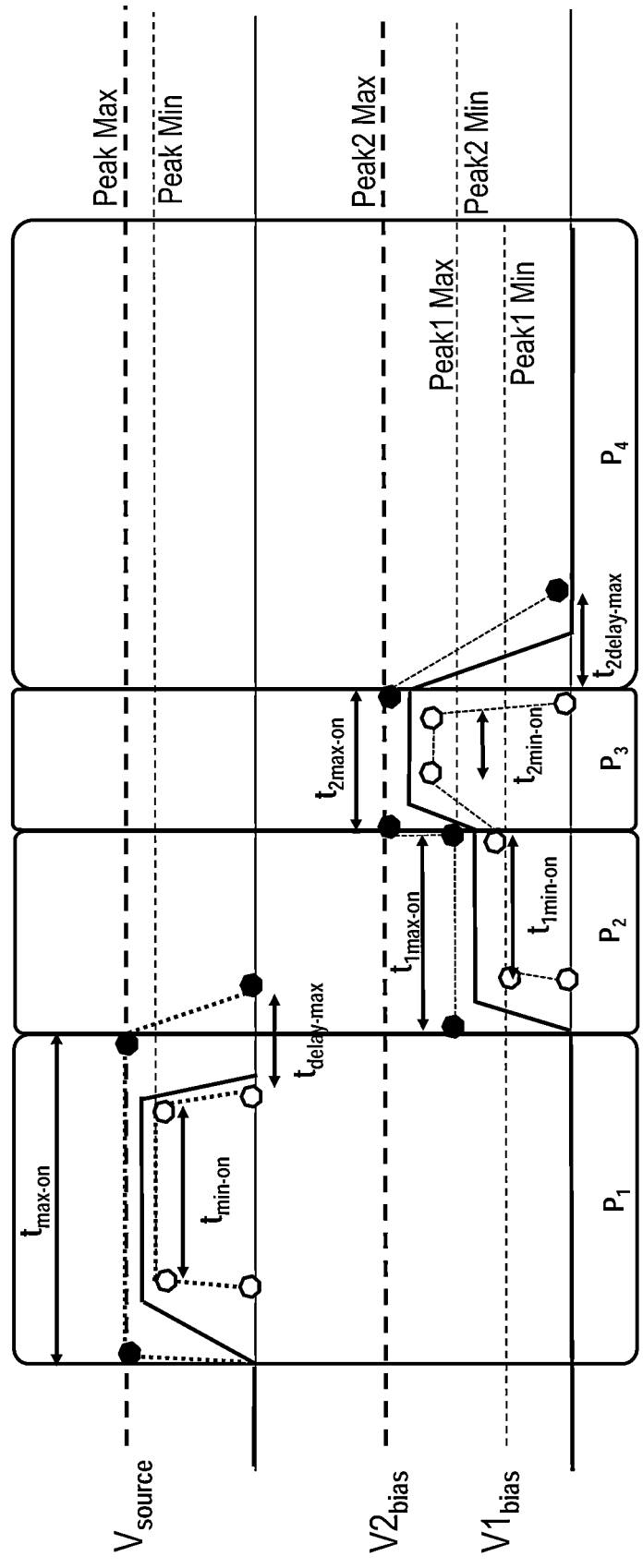
FIG. 5 is a graph illustrating various timing parameters corresponding to power signals that may be supplied to a plasma process chamber, or measured plasma parameters.

In some embodiments, a single V-I sensor may be used to measure the pulses in the plasma from multiple plasma pulsing feeds supplied to the plasma process chamber 105. For example, the second V-I sensor 182 may be used to measure the voltages generated on the substrate from the source power and the bias power, thereby enabling the second V-I sensor 182 to measure both pulses generated from the source and the bias generators using one sensor. In some embodiments, when multiple frequencies are used to generate the source and/or bias voltages, the bias voltage from the $1^{st}$ harmonic, $2^{nd}$ harmonic and $3^{rd}$ harmonic may be different from the $1^{st}$ harmonic of the source voltage. In such embodiments, one V-I sensor can be used to measure the timing of a basic dual pulse source/bias or triple pulse shape, such as shown in FIG. 5.

In some embodiments, a V-I analyzer 190 may receive the raw waveforms output from the first V-I sensor 180 and the second V-I sensor 182. The V-I analyzer 190 may be a signal processor (e.g., a digital signal processor), which is programmed to extract various RF signal characteristics from the raw waveforms output from the V-I sensors. Examples of RF signal characteristics that may be extracted by the V-I analyzer 190 include the magnitude of the voltage (|V|), the magnitude of the current (|I|), the phase angle (Φ) between V and I, and the peak RF power (|V||I| cos Φ). These RF signal characteristics may indicate various plasma impedance and plasma properties, such as for example, free electron and ion densities and ion/radical flux and energy. In some embodiments, the V-I analyzer 190 may perform harmonic analysis to extract multiple frequency components from the raw waveforms output from the V-I sensors. The V-I analyzer 190 may provide the RF signal characteristics to the control unit 170 shown in FIG. 1.

In some embodiments, a Vdc sensor 184 may be included within the plasma process chamber 105 to provide a direct current voltage (Vdc) measurement of the plasma 160 generated within the plasma process chamber. The Vdc sensor 184 may be coupled to the plasma processing system focus ring (not shown), the chuck 115 or the substrate 110. It will be recognized that a Vdc sensor may also be located in other areas of the plasma process chamber 105. The Vdc measurement signal obtained by the Vdc sensor 184 may be supplied to the control unit 170 and used for process control. Example embodiments of a Vdc sensor are described in U.S. Patent Application Publication No. US 2021/0013005, which is expressly incorporated herein by reference in its entirety.

In some embodiments, an optical sensor 186 (e.g., an optical photodiode) may be included within the plasma process chamber 105 to detect an intensity of the plasma 160 generated within the plasma process chamber. In some embodiments, the optical sensor 186 may be coupled to a dielectric (e.g., dielectric 318 of FIG. 3A) that is coupled to the plasma process chamber 105 and utilized to provide an even distribution of electromagnetic radiation within the plasma process chamber 105. In other embodiments, the optical sensor 186 may be coupled directly to/within the plasma process chamber 105 for measuring the optical intensity of the plasma 160 generated therein.

In alternative embodiments, optical sensors can be used to measure the optical emission spectra of the plasma 160, for example, by measuring radical concentrations using specific emission lines and combinations of emission lines and ratios. This can be achieved through the use of optical filters or other methods commonly known. Using optical sensors to measure the optical emission spectra of the plasma 160 can provide a real-time optical plasma response that can be compared to the electrical pulsed power input signal (e.g., the power, voltage or current of the source or bias power signal). The optical signal provided by the optical sensors allows another measurement of time relationship that can be controlled to provide an optimal plasma to the substrate surface.

In some embodiments, a pressure controller and measurement system 188 may be coupled to the plasma process chamber 105 to measure and control a chamber pressure within the plasma process chamber. In some embodiments, the pressure measurement may be provided to the control unit 170 and used as part of the control of the pulsed plasma process. For example, during a pulsed plasma process, the pulse parameters (e.g., the pulse on-time or pulse magnitude) and/or the chamber pressure may be adjusted, thus controlling the plasma measurements.

Figure 2A:
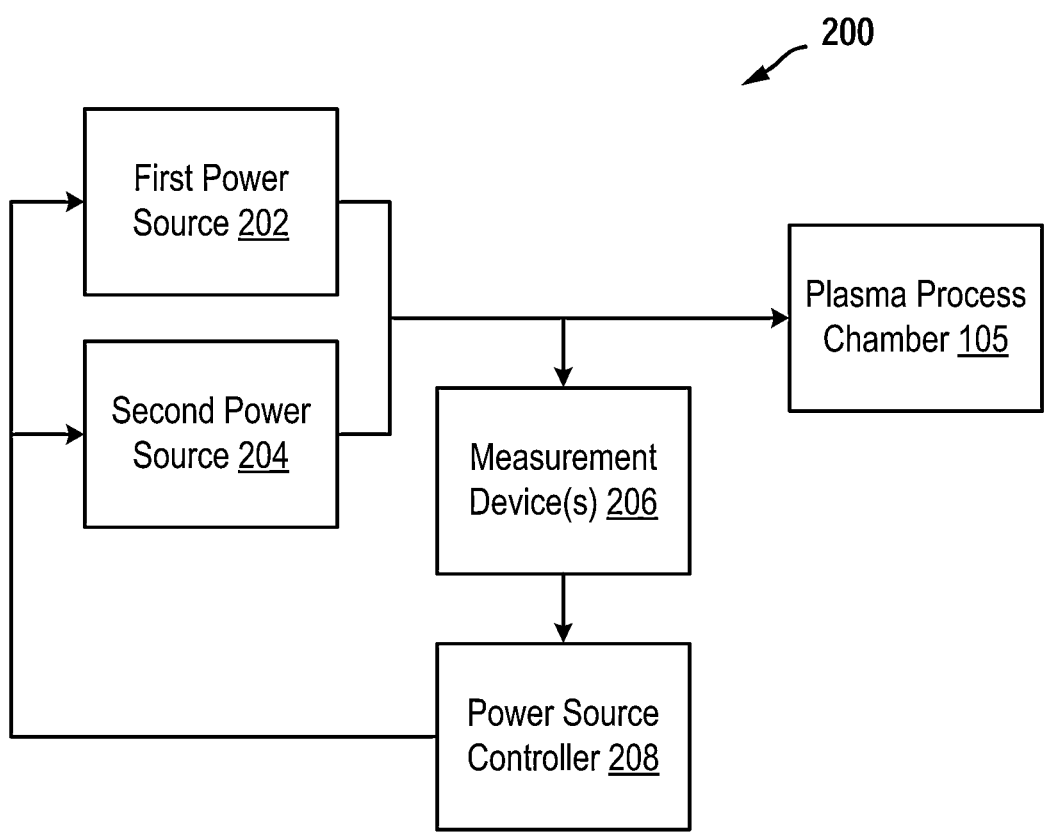
FIGS. 2A-2B are block diagrams illustrating exemplary embodiments of a system to control plasma process performance in a plasma processing system.
Figure 2B:
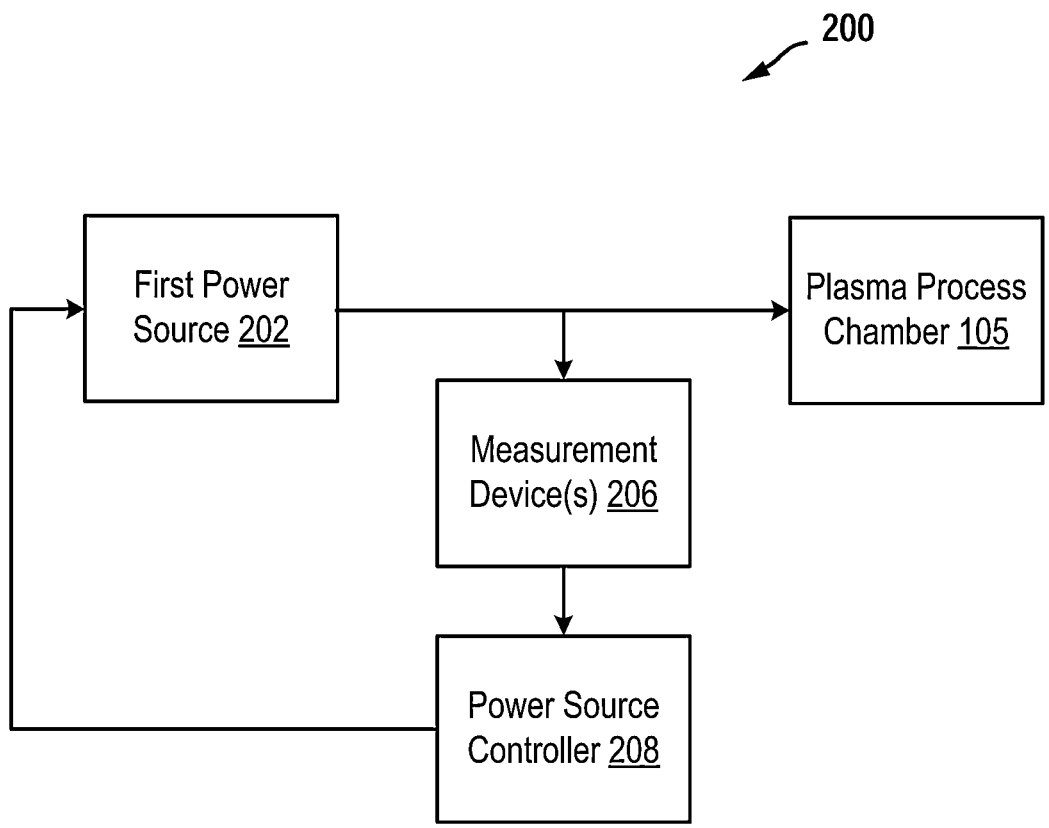

FIGS. 2A and 2B illustrate various embodiments of a system 200 that may be utilized to control plasma process performance in a plasma processing system. In one embodiment, the system 200 shown in FIG. 2A or FIG. 2B may be implemented integrally with the plasma processing system 100 illustrated in FIG. 1. For example, the system 200 may generally include one or more power sources (e.g., a first power source 202 and/or a second power source 204) coupled to supply a first power signal and a second power signal to the plasma process chamber 105 to generate a plasma 160 within the plasma process chamber, one or more measurement devices 206 coupled to collect real-time data corresponding to the first power signal, the second power signal or the plasma 160, and a power source controller 208 coupled to utilize the real-time data collected by the measurement device(s) 206 to control various properties of the plasma 160 generated within the plasma process chamber 105. Alternatively, aspects of the system 200 may be implemented as separate, add-on or additional features of system 100. For example, the measurement devices may also be coupled to the plasma process chamber to obtain data as to plasma conditions, such data also being to control the pulse timing parameters.

In some embodiments, a plurality of power sources may be used to generate and supply the first power signal and the second power signal to the plasma process chamber 105. As shown in FIG. 2A, for example, a first power source 202 may be coupled to supply the first power signal and a second power source 204 may be coupled to supply a second power signal to the plasma process chamber 105. In other embodiments, the first power signal and the second power signal may be generated and supplied from a single power source. As shown in FIG. 2B, for example, the first power source 202 may be coupled to supply the first power signal and the second power signal to the plasma process chamber 105. In the embodiment shown in FIG. 2B, the first power source 202 may be supply the first power signal and the second power signal to a single electrode to provide power to the plasma process chamber.

The first power source 202 and the second power source 204 may be RF and/or DC power sources or power generators, and/or DC power supplies. More specifically, the first power source 202 and the second power source 204 may each be configured to generate a power signal using a set of parameters (e.g., amplitude, frequency, phase, pulse on-time or pulse width, pulse off-time, etc.), which can be varied according to system requirements and plasma performance. In one embodiment, the first power source 202 may supply source power at a first set of parameters and the second power source 204 may supply bias power at a second set of parameters to the plasma process chamber 105. As described in more detail below, one or more timing parameters (e.g., the pulse on-time and/or the pulse-off time) of the source power may be adjusted to control the plasma density of the plasma 160 generated within the plasma process chamber 105. Likewise, one or more timing parameters (e.g., the pulse on-time and/or the pulse-off time) of the bias power may be adjusted to control the ion flux/energy of the generated plasma.

The one or more measurement devices 206 may be coupled and configured to generate measurement data that is in-situ and/or ex-situ of the plasma chamber. In one example, the one or more measurement devices 206 may be configured to generate ex-situ measurement data by measuring one or more characteristics of the power supplied to the plasma process chamber 105. In another example, the one or more measurement devices 206 may be configured to generate in-situ measurement data by measuring the response of the plasma 160 generated within the plasma process chamber 105 to the power signal(s), the chamber pressure and/or the gas(es) delivered to the process chamber. Examples of measurement device(s) 206 are shown in FIGS. 1 and 3 and discussed further herein. The measurement data collected by the measurement device(s) 206 is provided to the power source controller 208.

The power source controller 208 is coupled to receive the measurement data collected by the measurement device(s) 206 and configured to control one or more parameters of the first power source 202, one or more parameters of the second power source 204 or the chamber pressure in response to the measurement data. In some embodiments, the measurement data may be collected by the measurement device(s) 206 and provided to the power source controller 208 in real-time, as a plasma process is being performed. By utilizing real-time data, the power source controller 208 may be configured to adjust parameter(s) of the first power source, parameter(s) the second power source and/or the chamber pressure in real-time to control the performance of the plasma process. In one embodiment, the power source controller 208 may be implemented in the control unit 170 shown in FIG. 1.

In one embodiment, the first power source 202 may supply source power at a first set of parameters and the second power source 204 may supply bias power at a second set of parameters to the plasma process chamber 105 to generate a plasma 160, which may be used to perform a plasma process (e.g., a plasma deposition, etch, sputtering, etc.) on a substrate 110. The measurement device(s) 206 may be configured to measure one or more characteristics of the source power, one or more characteristics of the bias power and/or a response of the plasma 160 generated within the plasma process chamber 105 to the source/bias power in real-time as the plasma process is being performed. For example, the measurement device(s) 206 may be configured to measure one or more of: the power (P) of an RF power signal (e.g., forward power, reflected power, standing wave power, total power, etc.) transmitted between an RF power source and the plasma process chamber 105, the voltage (V), current (I) and/or phase (Φ) of the RF power signal supplied to the plasma process chamber 105 to generate the plasma 160, the intensity or optical emission spectra of the plasma 160 generated within the plasma process chamber 105, and the direct current voltage (Vdc) level of the plasma 160 generated within the plasma process chamber 105. In some embodiments, the measurement device(s) may be additionally configured to measure a chamber pressure within the plasma process chamber 105.

In one embodiment, the power source controller 208 may use the measurement data provided by the measurement devices(s) 206 to adjust the first set of parameters utilized by the first power source 202, the second set of parameters utilized by the second power source 204 and/or the chamber pressure to control various properties of the plasma 160 generated within the plasma process chamber 105 during the plasma process. For example, the power source controller 208 may adjust the amplitude, frequency, phase, pulse on-time (i.e., pulse width), and/or pulse off-time of the source power supplied by the first power source 202 to control the plasma density of the plasma 160 generated within the plasma process chamber 105.

In addition or alternatively, the power source controller 208 may adjust the amplitude, frequency, phase, pulse on-time (i.e., pulse width), and/or pulse off-time of the bias power supplied by the second power source 204 to control the ion flux/energy of the plasma 160 generated within the plasma process chamber 105. In some embodiments, the power source controller 208 may maintain the bias power at low power to further control or add to the plasma density. By maintaining the bias power at low power, the plasma generated within the plasma process chamber 105 can be more stable both in terms of: (a) particles suspended above the substrate after a higher power pulse of the bias that is performing an etch and (b) generating byproducts, giving the byproducts time to be pumped out of the plasma process chamber without the plasma sheath completely collapsing.

Chamber pressure affects the pulse magnitude, slope and duration (or pulse width) of the measurement data provided by the measurement devices(s) 206. In some embodiments, the power source controller 208 may adjust the chamber pressure within the plasma process chamber 105 during a plasma process to control various characteristic(s) of the source power, the bias power and/or the plasma response to the source/bias power, all of which are sensitive to chamber pressure. For example, the power source controller 208 may increase the chamber pressure during the plasma process to reduce the amount of reflected power measured from the second power source 204 (e.g., a bias power source), while increasing the pulse width and decreasing the pulse amplitude of a current signal provided by the second power source 204. The increase in chamber pressure may also increase the pulse width and amplitude of optical intensity of the plasma 160 generated within the plasma process chamber 105. Other characteristics of the source power, the bias power and/or the plasma response to the source/bias power may also be changed by adjusting the chamber pressure.

In some embodiments, the first power source 202 and the second power source 204 may be connected to the same plasma generating device (e.g., source or bias), and the power signals supplied by the first and second power sources may be superimposed. In such embodiments, the power source controller 208 may control the first power source 202 to provide a continuous power or pulsed power to the plasma process chamber 105, and may adjust the on-time of the second power source 204 to be constant by adjusting the power or time of the second power source 204, or even the power of the first power source 202, to stay above a minimum value to maintain the optimum plasma characteristics for applying the pulse with the first power source 202.

Figure 3A:
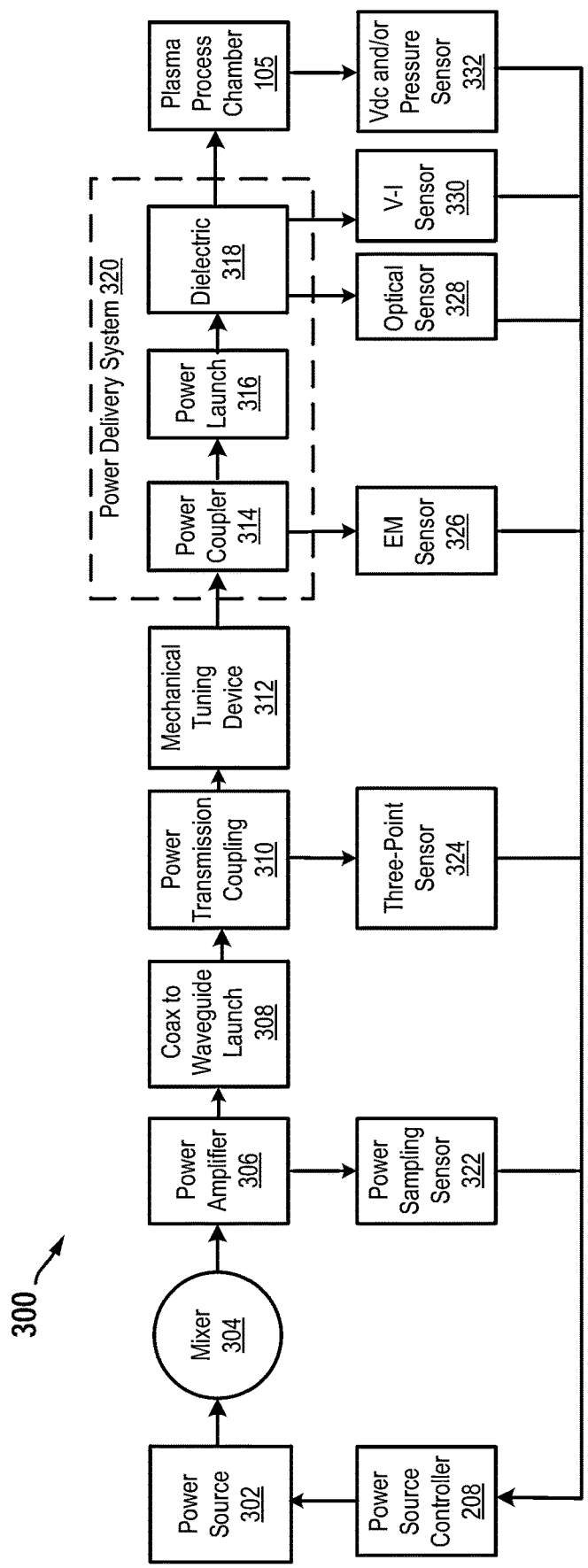
FIG. 3A is a block diagram illustrating another embodiment of a system to control plasma process performance in a plasma processing system.

FIG. 3A illustrates another embodiment of a system 300 to control plasma process performance in a plasma processing system. In the embodiment shown in FIG. 3A, the system 300 includes a power source 302 for generating a power signal, a variety of system components for propagating the power signal generated by the power source 302 to the plasma process chamber 105, and a number of measurement devices for measuring one or more aspects of the power signal supplied to the plasma process chamber 105 and/or the response of the plasma 160 generated within the plasma process chamber 105 to the power signal supplied to the plasma process chamber 105. In the embodiment shown in FIG. 3A, the system components used to propagate the power signal to the plasma process chamber 105 include a mixer 304, power amplifier 306, coaxial cable (coax) to waveguide launch 308, power transmission coupling 310, mechanical tuning device 312, power coupler 314, power launch 316, and dielectric 318. It is recognized, however, that additional or alternative components may also be used to transfer a RF and/or DC power signal to the plasma process chamber 105.

In some embodiments, the RF power source 302 shown in FIG. 3A may have a single output for generating one power signal. For example, the power source 302 shown in FIG. 3A may be the first power source 202 or the second power source 204 described above in reference to FIG. 2A or 2B. In such embodiments, the system 300 may include a set of system components and a set of measurement devices for the first power source 202 and for the second power source 204.

In another embodiment, the power source 302 shown in FIG. 3A may include a multi-output RF or DC power source capable of utilizing a first set of parameters to generate a first power signal on a first power output, and a second set of parameters to generate a second power signal on a second power output. In such an embodiment, a mixer 304 may be included to switch between the first power signal and the second power signal generated by the multi-output power source.

In the embodiment shown in FIG. 3A, the power signal generated by the power source 302 is provided to the power amplifier 306 for amplification. For example, the power amplifier 306 may amplify the (RF and/or DC) power signal generated by the power source 302 to a level suitable for maintaining a plasma field in the plasma process chamber 105. In some embodiments, a power sampling sensor 322 may sample the power signal output from the power amplifier 306. For example, the power sampling sensor 322 may measure the forward power and/or the reflected power of the power signal output from the power amplifier 306. The power sampling sensor 322 is one example of an ex-situ of the plasma chamber measurement device that may be included within the system 300 for obtaining ex-situ measurement data (e.g., forward power and/or the reflected power) obtained from the power signal output from the power amplifier 306.

The output of the power amplifier 306 is coupled to the coax to waveguide launch 308, which is coupled to the power transmission coupling 310. The power transmission coupling 310 may generally include a waveguide. In some embodiments, a multi-point sensor, such as three-point sensor 324, may be used to measure a standing wave formed within the waveguide. For example, the three-point sensor 324 may take measurements of power in the waveguide at three points in the standing wave, where each point is separated by a known distance. In a specific embodiment, the known distance may be one eight (⅛) of a wavelength of the standing wave formed within the waveguide. The three-point sensor 324 is another example of an ex-situ of the plasma chamber measurement device that may be included within the system 300 for obtaining ex-situ measurement data (e.g., multiple power measurements) from the RF power signal propagating in the waveguide.

In some embodiments, the power transmission coupling 310 may be coupled to a mechanical tuning device 312. If included, the mechanical tuning device 312 may provide adjustable mechanical tuning to the power signal supplied to the plasma process chamber 105. For example, the mechanical tuning device 312 may provide mechanical adjustment to one or more electrical properties of the power signal. The mechanical tuning device 312 may be implemented as an adjustable waveguide stub, an adjustable slit, an adjustable iris or the like. In one embodiment, the mechanical tuning device 312 may include a single tuning component. Alternatively, the mechanical tuning device 312 may include multiple tuning components.

The power transmission coupling 310 (or the mechanical tuning device 312) is coupled to the power coupler 314. In some embodiments, an electromagnetic (EM) sensor 326 may be coupled to measure electromagnetic energy in the power coupler 314. In one embodiment, the EM sensor 326 may include an electric field (E-field) pickup device. In such an embodiment, the EM sensor 326 may be used to measure the total power of the power signal at the power coupler 314. The EM sensor 326 is yet another example of an ex-situ of the plasma chamber measurement device that may be included within the system 300 for obtaining ex-situ measurement data (e.g., total power) of the power signal at the power coupler 314.

In some embodiments, a power launch 316 (e.g., a slit or aperture) may connect the power coupler 314 to the dielectric 318, which is coupled to the plasma process chamber 105. The energy emitted through the power launch 316 may be distributed across the dielectric 318 for even distribution of electromagnetic radiation within the plasma process chamber 105. In some embodiments, an optical sensor 328, such as a photodiode sensor, may be coupled to the dielectric 318 for detecting an optical intensity of the plasma 160 generated within the plasma process chamber 105. In other embodiments, the optical sensor 328 may be coupled directly to the plasma process chamber 105, as described above in reference to FIG. 1. In either case, the optical sensor 328 may be included within the system 300 for obtaining in-situ of the plasma chamber or ex-situ of the plasma chamber measurement data, such as for example, an optical intensity of the plasma 160 generated within the plasma process chamber 105.

In some embodiments, the power coupler 314, power launch 316 and dielectric 318 components may be implemented within a power delivery system 320, which is coupled and configured to carry the power signal to the plasma process chamber 105. The current (I) and voltage (V) waveforms transmitted through the power delivery system 320 are functions of position (x) and time (t), I(x, t) and V(x, t), and may each include multiple frequency components. When a single frequency component, f, is present, the current (I) and voltage (V) can be described by sinusoidal waveforms written compactly as $\text{Re}(I(x)e^{j\omega t})$ and $\text{Re}(V(x) e^{j(\omega t+\Phi)})$, where $\omega=2\pi f$, $j^2=-1$, and Re is the real part of the complex functions. The current (I) and voltage (V) waveforms each have a magnitude (|V| and |I|), and each waveform is separated from the other by a phase angle, $\Phi$. Examples of a power delivery system 320 that may be used in association with the present embodiments are described in U.S. patent application Ser. No. 16/913,526 entitled "RF Voltage and Current (V-I) Sensors and Measurement Methods," filed Jun. 26, 2020, and U.S. patent application Ser. No. 16/913,545 entitled "RF Voltage and Current (V-I) Sensors and Measurement Methods," filed Jun. 26, 2020, each of which is expressly incorporated herein in its entirety.

In some embodiments, one or more V-I sensors 330 may be coupled to the power delivery system 320 shown in FIG. 3A for sensing the current and voltage of the power signal(s) supplied to the plasma process chamber 105. The one or more V-I sensors 330 are an additional example of ex-situ measurement devices that may be included within the system 300 for obtaining ex-situ measurement data (e.g., voltage, current and/or phase) from the power signal(s) supplied to the plasma process chamber 105. The one or more V-I sensors 330 may generally be configured as described in the incorporated references mentioned above. For example, the one or more V-I sensors 330 may use geometrical symmetry and differential measurement methods to provide V and I with high precision at the position, x, of the sensor. In some embodiments, multiple V-I sensors 330 may be used at various locations along the power delivery system 320 to probe the signals there. Since V and I are functions of position, x, each V-I sensor may be positioned as close as possible to the respective desired measurement location. For example, if it is desirable to monitor and control a plasma process using accurate measurements of the voltage and current of the power signal provided to the plasma process chamber 105, then the V-I sensor used for that purpose may be positioned close to where the power signal enters the plasma process chamber 105.

In some embodiments, Vdc and/or pressure sensor(s) 332 may be included within the plasma process chamber 105 to provide a direct current voltage (Vdc) measurement of the plasma 160 generated within the plasma process chamber and/or a measurement of a chamber pressure within the process chamber. Thus, in some embodiments the sensor(s) of block 332 connected to the chamber may include one sensor (either a Vdc sensor or a pressure sensor) or multiple sensors (a Vdc sensor and a pressure sensor). Note, as mentioned above, an optical sensor may also be connected to the chamber. The Vdc and/or pressure sensor(s) 332 are other examples of an in-situ measurement devices that may be included within the system 300 for obtaining in-situ measurement data (e.g., Vdc level) of the plasma 160 generated within the plasma process chamber 105. In some embodiments, the Vdc sensor may be coupled to the plasma processing system focus ring (not shown), the chuck 115 or the substrate 110 as described above in reference to FIG. 1. It will be recognized that a Vdc sensor may also be located in other areas of the plasma process chamber 105. One example of a Vdc sensor that may be used in association with the present embodiments is described in U.S. Patent Application Publication No. US 2021/0013005, which is incorporated herein by reference.

In the system 300 shown in FIG. 3A, measurement data from the power sampling sensor 322, the three-point sensor 324, the EM sensor 326, the optical sensor 328, the V-I sensor 330 and the Vdc and/or pressure sensor(s) 332 are provided to the power source controller 208. In some embodiments, the power source controller 208 may use the measurement data received from one or more of these measurement devices (e.g., one or more of sensors 322, 324, 326, 328, 330 and 332) to provide operational signals to the power source 302 for controlling the power signal supplied to the plasma process chamber 105. Although the optical sensor 328 is shown in FIG. 3A as coupled to the power delivery dielectric 318, the optical sensor 328 may be alternatively implemented using a separate window on the plasma chamber 105.

Figure 3B:
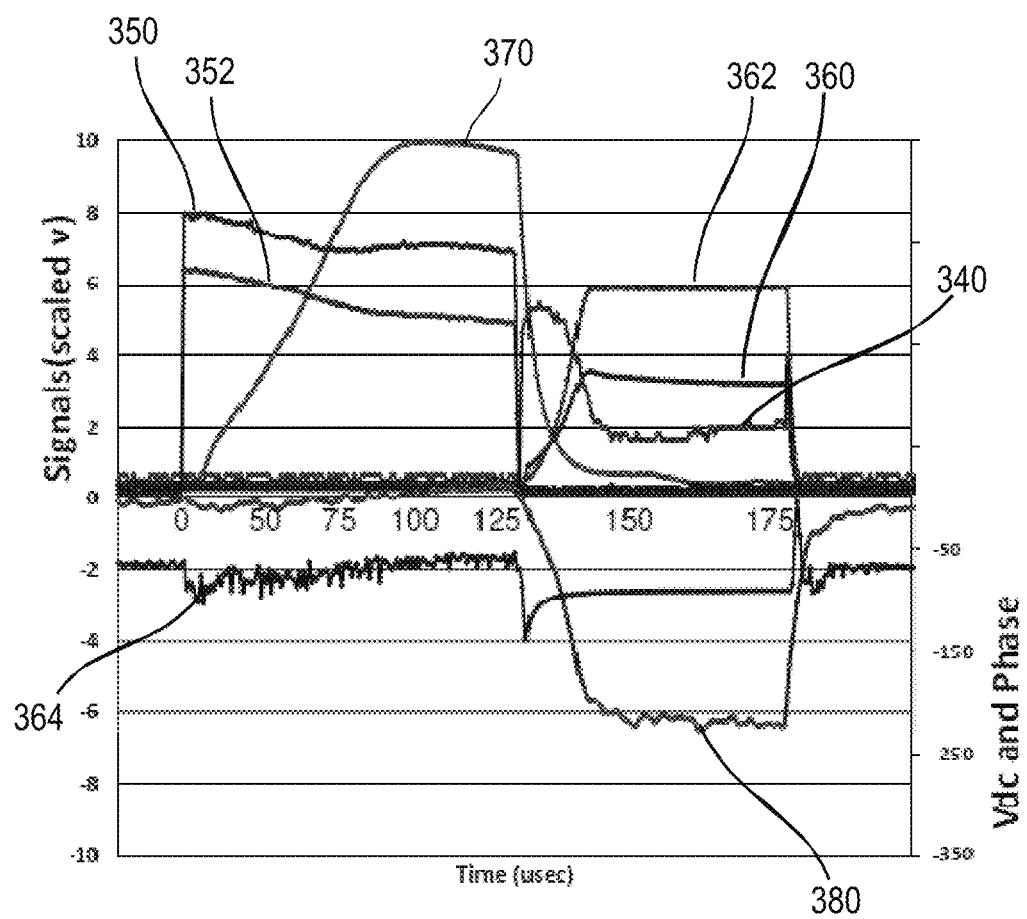
FIG. 3B is a graph illustrating examples of measurement data that may be obtained from one or more measurement devices, which may be included within any of the systems shown in FIGS. 1, 2A-2B and 3A.

FIG. 3B is a graph illustrating examples of measurement data that may be obtained from one or more of the measurement devices shown in FIGS. 1, 2A-2B and 3A. The graph shown in FIG. 3B plots the bias reflected power 340, the source voltage 350, the source current 352, the bias voltage 360, the bias current 362 and the optical intensity 370 in the top portion of the graph, and the bias phase 364 and the direct current voltage (Vdc) 380 (measured at the substrate) in the bottom portion of the graph. The signals shown in FIG. 3B were obtained from various measurement devices, as set forth above, while supplying a 500W source power signal for 125 microseconds (usec) and a 100W bias power signal for 100 usec to the plasma process chamber. As shown in FIG. 3B, the bias reflected power 340 increases during ignition and stabilizes after ignition.

In one example embodiment, the power source controller 208 may correlate the voltage (V) and current (I) signals received from the V-I sensor(s) 330, the Vdc signals received from the Vdc sensor, pressure measurements from the pressure sensor, and/or the optical intensity signals received from the optical sensor 328 to plasma density, ion flux and ion energy. Furthermore, the power source controller 208 may use the measurement data received from the V-I sensor(s) 330, the Vdc and/or pressure sensor(s) 332 and/or the optical sensor 328 to better characterize and/or control the plasma process. For example, the power source controller 208 may use the received measurement data to adjust one or more parameters (e.g., the amplitude, frequency, phase, pulse on-time, pulse off-time, etc.) of the source and/or bias power signals supplied to the plasma process chamber 105 to maintain a desired plasma density and/or a desired ion energy or flux during a plasma process. In addition or alternatively, the power source controller 208 may adjust the chamber pressure to maintain a desired plasma density and/or a desired ion energy or flux during a plasma process.

In some embodiments, the power source controller 208 may receive the voltage (V), current (I) and/or phase (Φ) from the V-I Sensor(s) 330 and then calculate the plasma density and ion flux at the substrate by transforming the V, I and/or Φ measurements received from the V-I Sensor(s) 330 to the substrate with a RF impedance model. In other words, the V-I Sensor(s) 330 obtain real measurements (V, I, Φ) from the power signal(s) that are used to provide virtual measurements at the substrate.

One of ordinary skill will recognize that one or more additional components may be added to the system 300 shown in FIG. 3A to enhance operation of the methods and processes described herein. Further, one of ordinary skill will recognize that one or more components of the system of FIG. 3A may be omitted, depending upon system requirements and hardware availability. The embodiment of FIG. 3A is merely illustrative of options that may be used in conjunction with the present embodiments, but is not intended to limit the scope of the present invention to any particular embodiments.

Figure 4:
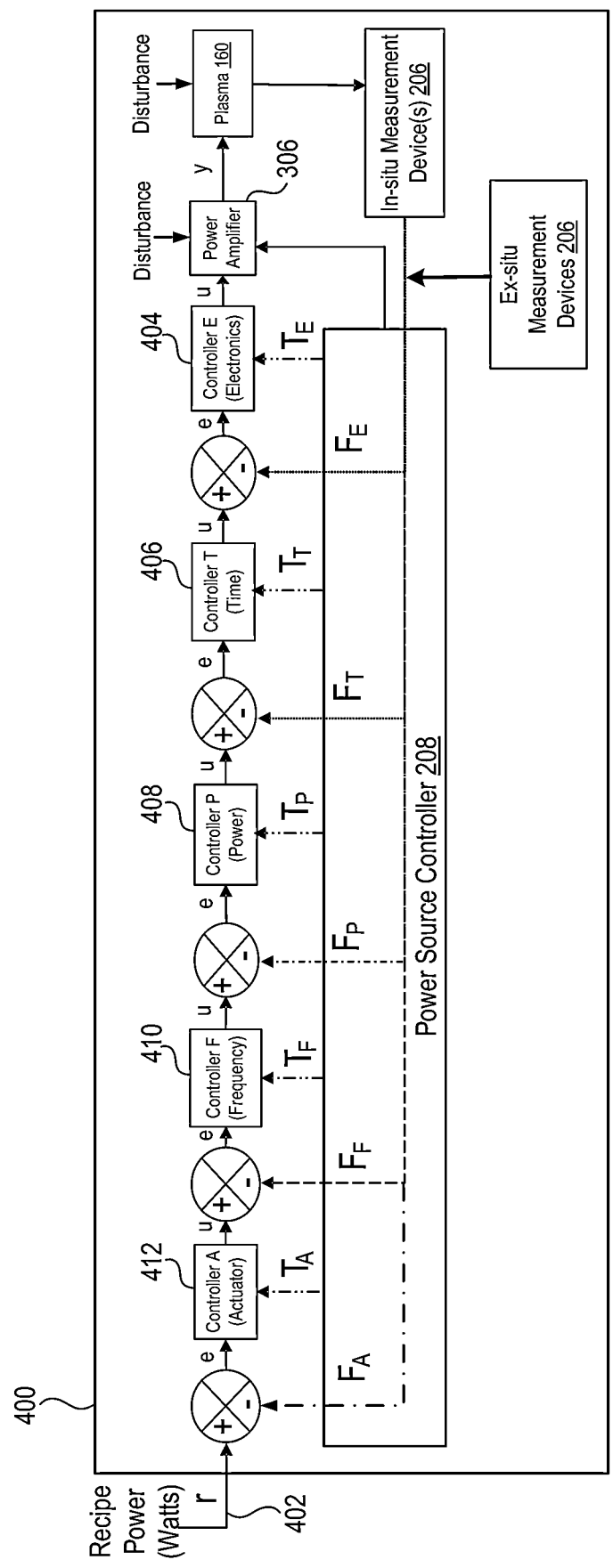
FIG. 4 is a block diagram illustrating a control loop for controlling plasma process performance.

FIG. 4 is a block diagram illustrating a control loop 400, which may be used by the system 200 shown in FIGS. 2A-2B and/or the system 300 shown in FIG. 3A to control plasma process performance. In some embodiments, the control loop 400 shown in FIG. 4 may be implemented as an iterative loop, which receives a specified power recipe (r) 402 with preset values as input. In the example control loop 400 shown in FIG. 4, the power amplifier 306 shown in FIG. 3A provides era power signal (e.g., a source power signal and/or a bias power signal) to the plasma process chamber 105 to create the plasma 160 being monitored by the measurement device(s) 206. The power signal may be a pulsed DC and/or RF signal having an amplitude, frequency, phase, pulse on-time (i.e., pulse width) and pulse off-time. The specified power recipe (r) 402 may also contain the pulse timing for the power source. When using multiple frequencies and amplitudes with one power source, the recipe 402 has time dependent parameters with adjustable limits, such as shown for example in FIG. 5, like power ranges that can be automatically adjusted along with pulse duration and timing relationships between phases in a pulse sequence.

One or more measurement devices 206 may be used to measure one or more characteristics of the power signal provided to the plasma process chamber 105, the plasma response to the prescribed power characteristics and/or the chamber pressure. As noted above, the one or more measurement devices 206 may include in-situ measurement devices and/or ex-situ measurement devices. In response to the measurement data received from the measurement devices 206, the power source controller 208 may adjust one or more control knobs or control settings (e.g., control blocks 404, 406, 408, 410 and 412) of the control loop 400 to achieve a desired plasma performance. Changes in a pulse sequence can be updated simultaneously or separately. For example, control blocks 404 and 410 are fast control loops that adjust the impedance matching and interact with the control block 408 when it needs to be adjusted. In some embodiments, pulse timing settings can be adjusted at control block 406 in a feed forward update to compensate for non-optimal pulse characteristics and extend the pulse duration. In some embodiments, pulse timing settings can also be adjusted at control block 406 in a feedback update (not shown in FIG. 4) to change the timing relationships between multiple pulses and between multiple sources, such as a source power source and a bias power source.

In one embodiment, the power source controller 208 may begin by adjusting an electronic tuning setting at control block 404. The electronic tuning control setting updates may be coordinated for the plasma power control plan defined by the power recipe (r). Next, the power source controller 208 may adjust one or more timing settings at control block 406. In some embodiments, the power source controller 208 may adjust a pulse on-time (i.e., a pulse width) of a source power pulse provided to the plasma process chamber 105 to control a plasma density of the plasma 160 generated within the plasma process chamber. In addition or alternatively, the power source controller 208 may adjust a pulse on-time and/or a pulse off-time of a bias power pulse provided to the plasma process chamber 105 to control the ion flux/energy of the plasma 160 generated within the plasma process chamber. After the timing setting(s) are adjusted, the electronic tuning setting may be updated again at control block 404.

Next, the power source controller 208 may adjust a power amplitude setting at control block 408. In some embodiments, the power amplitude setting may be iteratively updated until a threshold plasma measurement is met. Once the power amplitude level is adjusted at control block 408, the power source controller 208 may readjust the electronic tuning setting at control block 404 and the timing setting(s) at control bock 406. Then, the power amplitude setting may be adjusted at control block 408 for a second time.

Next, the power source controller 208 may adjust a frequency tuning setting at control block 410. In some embodiments, the frequency tuning setting may be updated to adjust a frequency of the RF power signal provided to the plasma process chamber 105. Once the frequency tuning setting is adjusted, the power source controller 208 may readjust the electronic tuning setting at control block 404, the timing setting(s) at control bock 406 and the power amplitude setting at control block 408, as set forth above.

Next, the power source controller 208 may adjust a mechanical tuning (e.g., a pressure control actuator or a matcher control actuator) setting at control block 412. In some embodiments, the mechanical tuning setting adjusted at control block 412 may be a pressure control setting used to adjust a chamber pressure within the plasma process chamber. In other embodiments, the mechanical tuning setting may be used to adjust impedance matching. Once the mechanical tuning setting is adjusted, the process of readjusting the electronic tuning setting at control block 404, the timing setting(s) at control bock 406, the power amplitude setting at control block 408 and the frequency tuning setting at control block 410 may be repeated.

FIGS. 2-4 provide various embodiments of control systems and control loops that may be used to control a plasma process. In some embodiments, the techniques described herein may be utilized to characterize and control a plasma process during real-time substrate processing. The techniques described herein may also be utilized to characterize a plasma processing system, either initially or periodically, so as to maintain process control throughout use of the plasma processing system. The techniques described herein may generally be used to control a wide variety of plasma properties, including but not limited to plasma density and ion flux/energy.

In preferred embodiments of the present disclosure, measurement data obtained from one or more measurement devices is utilized to adjust one or more timing parameters of the power signal(s) supplied to the plasma process chamber, so as to maintain a desired plasma density and/or a desired ion flux/energy during a plasma process. In particular, the measurement data obtained from the one or more measurement devices may be used to provide feedforward or feedback control of the one or more timing parameters of the power signal(s) during the plasma process to better control the plasma process and improve the plasma process performance.

FIG. 5 illustrates various timing parameters of power signals that may be supplied to a plasma process chamber during a plasma process. In particular, FIG. 5 provides an example pulse template for source voltage ($V_{source}$) and bias voltage ($V1_{bias}$ and $V2_{bias}$) pulses, which may be supplied to a plasma process chamber during various phases of a pulsed plasma process. The pulse template shown in FIG. 5 illustrates various timing parameters of the source and bias voltage pulses. Initial values for these timing parameters may be specified within a power recipe as power recipe settings, which may be adjusted during the pulsed plasma process to control various properties of the plasma, such as plasma density and ion flux/energy. In some embodiments, measurements of $V_{source}$ and $V_{bias}$ may be obtained from two separate measurement devices at two different locations, such as the V-I sensors 180 and 182 shown in FIG. 1. Alternatively, measurements of $V_{source}$ and $V_{bias}$ may be obtained from a single measurement device, which is located in such a way that it can sense the power signals from multiple power sources that relate to the plasma substrate measurements of importance. For example, the V-I sensor 182 shown in FIG. 1 may be used to obtain the $V_{source}$ and $V_{bias}$ measurements shown in FIG. 5.

It is recognized that, although source and bias voltages are illustrated in the example pulse template shown in FIG. 5, other parameters of the source and bias power signals may also be used to control plasma properties. For example, the current (I) or power (P) measured from the source and bias power sources, the Vdc level measured from the plasma process chamber and/or the optical intensity or optical emission spectra of the plasma may also be used to characterize and control a pulsed plasma process in accordance with the techniques described herein.

During a first phase ($P_1$) of the pulsed plasma process, a source voltage ($V_{source}$) pulse is provided to the plasma process chamber to generate a plasma. The $V_{source}$ pulse has a desired amplitude and a desired pulse width, as specified in the power recipe. For example, the power recipe may specify the $V_{source}$ pulse as having a desired amplitude between a minimum voltage peak (Peak Min) and a maximum voltage peak (Peak Max), and a desired pulse width between a minimum on time ($t_{min-on}$) and a maximum on time ($t_{max-on}$). Together, the amplitude and pulse width of the $V_{source}$ pulse may be selected and/or adjusted to control the plasma density of the generated plasma.

For example, the area under the curve of the $V_{source}$ pulse could be a measurement calculation that represents the plasma density variation over time. If the minimum value is not met during the $V_{source}$ pulse, the power source controller can extend the pulse on-time to $t_{delay-max}$ and make adjustments in power or other control parameters to maintain the $t_{min-on}$ specification. These updates can be averaged over a number of pulses and then the control parameters of the source voltage can be updated to maintain the desired pulse profile without continually extending the pulse duration. Though described herein with regard to controlling plasma density in one embodiment, it will be recognized that other characteristics of the plasma process may be similarly controlled utilizing the techniques described herein. Other characteristics include, for example but are not limited to, an electron temperature, an ion flux and/or an ion energy of the plasma.

During subsequent phase(s) of the pulsed plasma process, the source voltage is turned off and a bias voltage is provided to the plasma process chamber to control the ion flux/energy of the generated plasma. In the example pulse template shown in FIG. 5, a first bias voltage ($V1_{bias}$) pulse is provided to the plasma process chamber during a second phase ($P_2$) and a second bias voltage ($V2_{bias}$) pulse is provided to the plasma process chamber during a third phase ($P_3$) of the pulsed plasma process. Like the $V_{source}$ pulse, the bias voltage pulses may each have a desired amplitude and a desired pulse width, as specified in the power recipe. For example, the power recipe may specify the $V1_{bias}$ pulse as having a desired amplitude between a minimum voltage peak (Peak1 Min) and a maximum voltage peak (Peak1 Max) and a desired pulse width pulse between a minimum on time ($t_{1min-on}$) and a maximum on time ($t_{1max-on}$) to achieve a plasma that provides a polymerization of the sidewalls of a profile. The power recipe may further specify the $V2_{bias}$ pulse as having a desired amplitude between a minimum voltage peak (Peak2 Min) and a maximum voltage peak (Peak2 Max) and a desired pulse width between a minimum on time a ($t_{2min-on}$) and a maximum on time ($t_{2max-on}$) to control ion flux/energy in the plasma that etches the bottom of a feature. The areas under the bias voltage curves reflect the total ion dose. During a fourth phase ($P_4$)

of the pulsed plasma process, the source and bias voltages are turned off until the next cycle of the pulsed plasma process.

Figure 6:
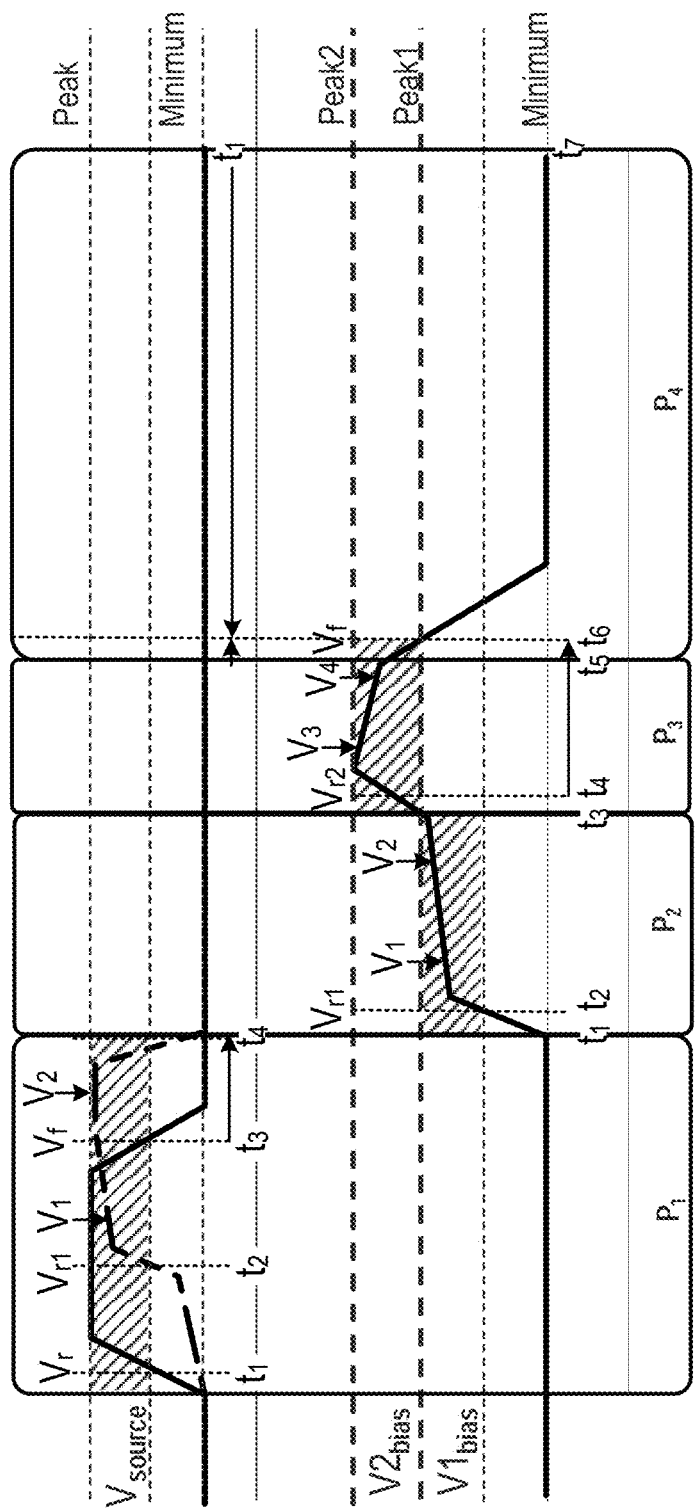
FIG. 6 is a graph illustrating various control methods that may be used to adjust one or more timing parameters of the power signals supplied to a plasma process chamber in accordance with the techniques described herein.

FIG. 6 is a graph illustrating various control methods that may be used to adjust one or more timing parameters of a power signal supplied to a plasma process chamber. In particular, the graph shown in FIG. 6 provides various feedforward and feedback control methods that may be used to adjust timing parameter(s) of the power signal(s) supplied to the plasma process chamber to control the plasma density and/or the ion flux/energy of a plasma generated therein. The feedforward and feedback control methods shown in FIG. 6 may be used to control plasma performance in real-time, as a plasma process is being performed in the plasma process chamber. The control methods shown in FIG. 6 may generally be performed by a controller, such as for example, the control unit 170 of FIG. 1 or the power source controller 208 of FIGS. 2-4.

The graph shown in FIG. 6 illustrates a source voltage ($V_{source}$) pulse and a bias voltage ($V_{bias}$) pulse during one cycle of a pulsed plasma process. $V_r$ is a rising edge threshold voltage and $V_f$ is a falling edge threshold voltage for the $V_{source}$ and $V_{bias}$ pulses. Pulse parameters V1, V2, V3 and V4 are set times in the source/bias voltage pulse relative to $V_r$. In some embodiments, the $V_{source}$ and $V_{bias}$ pulses shown in FIG. 6 may be monitored by measurement device(s) coupled to the plasma process chamber. Example measurement devices are discussed above in reference to FIGS. 1-4. Although source and bias voltages are illustrated in FIG. 6, the control methods described herein may additionally or alternatively utilize other parameters of the RF power signals (e.g., current, power, Vdc, optical intensity, etc.) to control plasma properties.

In some embodiments, a feedforward control method may be used during the first phase ($P_1$) of a pulsed plasma process to adjust a timing parameter of the source voltage ($V_{source}$) supplied to a plasma process chamber, so as to maintain a desired plasma density during the pulsed plasma process. As shown in FIG. 6, for example, a power recipe may specify that the $V_{source}$ pulse (shown in solid lines) should ideally occur between the rising edge threshold voltage ($V_r$) measured at time $t_1$ and the falling edge threshold voltage ($V_f$) measured at time $t_3$. In other words, the power recipe may initially specify that the $V_{source}$ pulse have a specified pulse on-time (or pulse width) corresponding to $t_{on}=t_3-t_1$. In practice, however, the $V_{source}$ pulse (shown in dashed lines) supplied to the plasma process chamber may not meet the rising edge threshold voltage ($V_{r1}$) until time $t_2$. When this occurs, the feedforward control method shown in FIG. 6 may extend time $t_3$ to time $t_4$, thus providing a longer $V_{source}$ pulse on-time (i.e., a larger $V_{source}$ pulse width) to maintain a specified plasma density.

The feedforward control method used during the first phase ($P_1$) of the pulsed plasma process may be used to adjust the pulse on-time (or pulse width) of the source voltage, in real-time, during each cycle of the pulsed plasma process based on the measurement data generated by the measurement device(s) and received by the controller during that cycle. In one example embodiment, the measurement device(s) may detect a rising edge (e.g., $V_r$ or $V_{r1}$) of the $V_{source}$ pulse during each cycle of the pulsed plasma process. Based on the rising edge detected by the measurement device(s), the controller may adjust a falling edge ($V_f$) of the $V_{source}$ pulse during a corresponding cycle of the pulsed plasma process to control the pulse on-time (or pulse width) of the $V_{source}$ pulse, so as to maintain a specified plasma density. For example, if the rising edge (e.g., $V_{r1}$) of the $V_{source}$ pulse is not detected until time $t_2$, the controller may shift the falling edge ($V_f$) of the $V_{source}$ pulse to time $t_4$ to increase the $V_{source}$ pulse on-time and maintain a desired $V_{source}$ pulse width.

In some embodiments, another feedforward control method may be used during the second ($P_2$) and third ($P_3$) phases of the pulsed plasma process to adjust timing parameters of the bias voltage ($V_{bias}$) supplied to the plasma process chamber, so as to maintain a desired ion flux/energy during the pulsed plasma process. As shown in FIG. 6, for example, the $V_{bias}$ pulse supplied to the plasma process chamber may reach a first rising edge threshold voltage ($V_{r1}$) at time $t_2$, a second rising edge threshold voltage ($V_{r2}$) at time $t_4$ and a falling edge threshold voltage ($V_f$) at time $t_6$. When this occurs, the feedforward control method shown in FIG. 6 may extend time $t_5$ to time $t_6$, thereby providing a longer $V_{bias}$ on-time (i.e., a larger $V_{bias}$ pulse width) to maintain a specified ion flux/energy.

The feedforward control method used during the second ($P_2$) and third ($P_3$) phases of the pulsed plasma process may be used to adjust the pulse on-time (or pulse width) of the bias voltage, in real-time, during each cycle of the pulsed plasma process based on the measurement data generated by the measurement device(s) and received by the controller during that cycle. In one example embodiment, the measurement device(s) may detect a rising edge (e.g., $V_{r1}$ or $V_{r2}$) of the $V_{bias}$ pulse during each cycle of the pulsed plasma process. Based on the rising edge detected by the measurement device(s), the controller may adjust a falling edge ($V_f$) of the $V_{bias}$ pulse during a corresponding cycle of the pulsed plasma process to control the pulse on-time (or pulse width) of the $V_{bias}$ pulse, so as to maintain a specified ion flux/energy. For example, if the rising edge (e.g., $V_{r2}$) of the $V_{bias}$ pulse is not detected until time $t_4$, the controller may shift the falling edge ($V_f$) of the $V_{bias}$ pulse to time $t_6$ to increase the $V_{bias}$ pulse on-time and maintain a desired $V_{bias}$ pulse width.

In some embodiments, a feedback control method may be used during the fourth phase ($P_4$) of a pulsed plasma process to adjust the $V_{bias}$ pulse off-time and control the bias/source pulse interaction. As shown in FIG. 6, for example, the power recipe may initially specify that the source and bias voltages be turned off between time $t_5$ and time $t_7$ until the next cycle of the pulsed plasma process begins at time $t_1$. If the $V_{bias}$ pulse on-time is adjusted in a current cycle of the pulsed plasma process, however, the feedback control method shown in FIG. 6 may automatically adjust the on-time and the off-time of the $V_{bias}$ pulse in the next cycle of the pulsed plasma process based on the adjustment made during the current cycle. For example, if the $V_{bias}$ pulse on-time is extended in a current cycle of the pulsed plasma process, the feedback control method may automatically extend the pulse on-time and reduce the pulse off-time of the $V_{bias}$ pulse in the next cycle of the pulsed plasma process to control the $V_{bias}$ pulse width (or bias power) in the next cycle.

Figure 7:
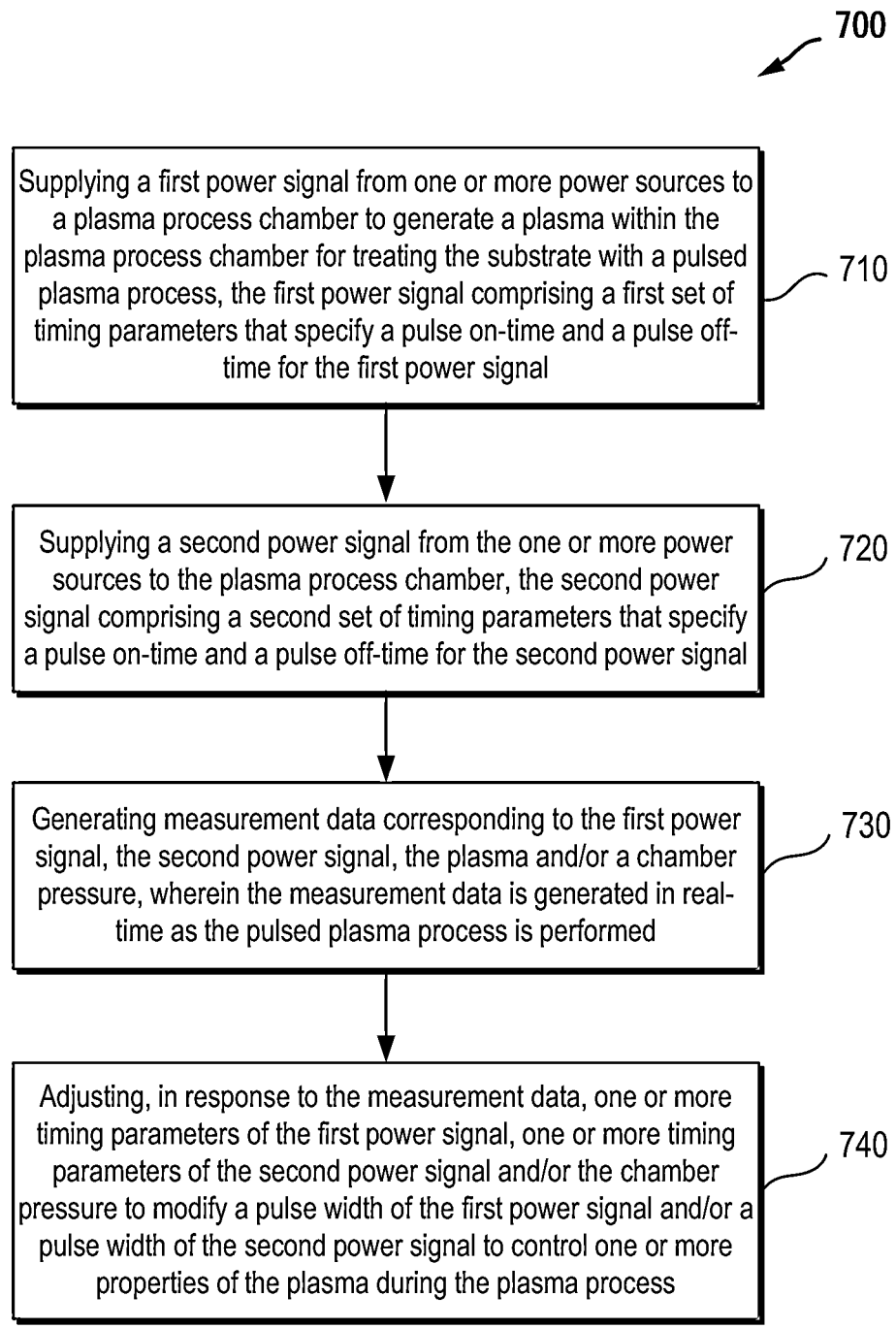
FIG. 7 is a flowchart diagram illustrating one embodiment of a method for controlling plasma performance in accordance with the techniques described herein.

FIG. 7 illustrates an exemplary method for controlling plasma performance in accordance with the techniques described herein. It will be recognized that the embodiment shown in FIG. 7 is merely exemplary and additional methods may utilize the techniques described herein. Further, additional steps may be added to the method shown in the FIG. 7, as the steps described are not intended to be exclusive. Moreover, the order of the steps is not limited to the order shown in the figure as different orders may occur and/or various steps may be performed in combination or at the same time.

FIG. 7 is a flowchart diagram illustrating one embodiment of a method 700 for controlling plasma process performance in a system for treating a substrate, where the system includes one or more power sources. The method 700 shown in FIG. 7 may generally be performed in a plasma processing system. Although not limited to such an embodiment, FIG. 1 illustrates one embodiment of a plasma processing system 100 that may utilize the method 700. Various steps of the method 700 shown in FIG. 7 may be performed by a controller coupled to, or included within, the plasma processing system. In some embodiments, for example, the control unit 170 shown in FIG. 1 and/or the power source controller 208 shown in FIGS. 2-4 may be used to perform these steps.

In general, the method 700 may include supplying a first power signal from the one or more power sources to a plasma process chamber to generate a plasma within the plasma process chamber for treating the substrate with a pulsed plasma process (in step 710). The first power signal may generally include a first set of timing parameters that specify a pulse on-time and a pulse off-time for the first power signal. The method 700 may further include supplying a second power signal from the one or more power sources to the plasma process chamber (in step 720). The second power signal may generally include a second set of timing parameters that specify a pulse on-time and a pulse off-time for the second power signal. The first power signal and the second power signal may be obtained from a single power source or may be obtained from a plurality of power sources.

The method 700 may further include generating measurement data corresponding to the first power signal, the second power signal, the plasma and/or a chamber pressure (in step 730). The measurement data may be generated in real-time as the pulsed plasma process is performed. The method 700 may further include adjusting, in response to the measurement data, one or more timing parameters of the first power signal, one or more timing parameters of the second power signal and/or the chamber pressure to modify a pulse width of the first power signal and/or a pulse width of the second power signal to control one or more properties of the plasma during the plasma process (in step 740). Although not strictly limited to such, the one or more properties of the plasma may include a plasma density, an ion flux and/or an ion energy of the plasma.

In some embodiments, the first power signal may be a source power signal. In such embodiments, the method 700 may adjust one or more timing parameters of the first power signal (in step 740) by adjusting the pulse on-time of the first power signal to control a plasma density of the plasma. More specifically, the method 700 may adjust one or more timing parameters of the first power signal (in step 740) by adjusting the pulse on-time of the first power signal, in real-time, during each cycle of the pulsed plasma process based on the measurement data generated during that cycle. For example, the method 700 may generate measurement data (in step 730) by detecting a rising edge of the first power signal during each cycle of the pulsed plasma process, and may adjust one or more timing parameters of the first power signal (in step 740) by adjusting a falling edge of the first power signal during each cycle of the pulsed plasma process to control the pulse on-time of the first power signal, so as to maintain a specified plasma density.

In other embodiments, the second power signal may be a bias power signal. In such embodiments, the method 700 may adjust one or more timing parameters of the second power signal (in step 740) by adjusting the pulse on-time of the second power signal to control an ion flux and/or an ion energy of the plasma. More specifically, the method 700 may adjust one or more timing parameters of the second power signal (in step 740) by adjusting the pulse on-time of the second power signal in real-time during each cycle of the pulsed plasma process based on the measurement data generated during that cycle. For example, the method 700 may generate measurement data (in step 730) by detecting a rising edge of the second power signal during each cycle of the pulsed plasma process, and may adjust one or more timing parameters of the second power signal (in step 740) by adjusting a falling edge of the second power signal during each cycle of the pulsed plasma process to control the pulse on-time of the second power signal, so as to maintain a specified ion flux and/or ion energy.

In some embodiments, the method 700 may adjust one or more timing parameters of the second power signal in the next cycle of the pulsed plasma process (in step 740) if the pulse on-time of the second power signal is adjusted during a current cycle of the pulsed plasma process. For example, the method 700 may the pulse on-time and the pulse off-time of the second power signal in the next cycle of the pulsed plasma process based on the adjustment made during the current cycle.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for controlling plasma process performance in a system for treating a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures. In some cases, the term "substrate" may be used to describe a patterned or unpatterned wafer, such as a device wafer or a carrier wafer.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for controlling plasma performance in a system for treating a substrate, the system including one or more power sources, the method comprising:
    supplying a first power signal from the one or more power sources to a plasma process chamber to generate a plasma within the plasma process chamber for treating the substrate with a pulsed plasma process, the first power signal comprising a first set of timing parameters that specify a pulse on-time and a pulse off-time for the first power signal;
    supplying a second power signal from the one or more power sources to the plasma process chamber, the second power signal comprising a second set of timing parameters that specify a pulse on-time and a pulse off-time for the second power signal;
    generating measurement data corresponding to the first power signal, the second power signal, the plasma and/or a chamber pressure, wherein the measurement data is generated in real-time as the pulsed plasma process is performed; and
    adjusting, in response to the measurement data, one or more timing parameters of the first power signal, one or more timing parameters of the second power signal and/or the chamber pressure to modify a pulse width of the first power signal and/or a pulse width of the second power signal to control one or more properties of the plasma during the plasma process.

2. The method of claim 1, wherein said supplying the first power signal and said supplying the second power signal comprise supplying the first power signal and the second power signal from a single power source.

3. The method of claim 1, wherein said supplying the first power signal comprises supplying the first power signal from a first power source, and wherein said supplying the second power signal comprises supplying the second power signal from a second power source distinct from the first power source.

4. The method of claim 1, wherein said generating measurement data comprises generating in-situ measurement data.

5. The method of claim 4, wherein said generating measurement data comprises measuring one or more of:
    an optical intensity or an optical emission spectra of the plasma generated within the plasma process chamber; and/or
    a direct current voltage (Vdc) level of the plasma generated within the plasma process chamber.

6. The method of claim 1, wherein said generating measurement data comprises generating ex-situ measurement data.

7. The method of claim 6, wherein said generating measurement data comprises measuring one or more of:
    a power, a voltage, a current and/or a phase of the first power signal;
    a power, a voltage, a current and/or a phase of the second power signal; and
    a power, a voltage, a current and/or a phase of at least one harmonic of the first power signal and/or the second power signal.

8. The method of claim 1, wherein the one or more properties of the plasma that are controlled comprise a plasma density, an electron temperature, a gas dissociation, an etch material selectivity, an ion flux and/or an ion energy of the plasma.

9. The method of claim 1, wherein the first power signal is a source power signal, and wherein said adjusting comprises adjusting the pulse on-time of the first power signal to control a plasma density of the plasma.

10. The method of claim 9, wherein said adjusting comprises adjusting the pulse on-time of the first power signal in real-time during a cycle of the pulsed plasma process based on the measurement data generated during the cycle.

11. The method of claim 9, wherein said generating measurement data comprises detecting a rising edge of the first power signal during a cycle of the pulsed plasma process, and wherein said adjusting comprises adjusting a falling edge of the first power signal during the cycle of the pulsed plasma process to control the pulse on-time of the first power signal, so as to maintain a specified plasma density.

12. The method of claim 1, wherein the second power signal is a bias power signal, and wherein said adjusting comprises adjusting the pulse on-time of the second power signal to control an ion flux and/or an ion energy of the plasma.

13. The method of claim 12, wherein said adjusting comprises adjusting the pulse on-time of the second power signal in real-time during a cycle of the pulsed plasma process based on the measurement data generated during the cycle.

14. The method of claim 12, wherein said generating measurement data comprises detecting a rising edge of the second power signal during each cycle of the pulsed plasma process, and wherein said adjusting comprises adjusting a falling edge of the second power signal during each cycle of the pulsed plasma process to control the pulse on-time of the second power signal, so as to maintain a specified ion flux and/or ion energy.

15. The method of claim 12, wherein if the pulse on-time of the second power signal is adjusted during a current cycle of the pulsed plasma process, said adjusting further comprises adjusting the pulse on-time and the pulse off-time of the second power signal in the next cycle of the pulsed plasma process based on the adjustment made during the current cycle.

16. The method of claim 1, wherein said adjusting is performed to control a relative timing between the first power signal and the second power signal.

17. The method of claim 16, wherein said adjusting is performed to control a time between the pulse off-time of the first power signal and the pulse on-time of the second power signal.

18. The method of claim 1, wherein said generating measurement data comprises using a single measurement device to measure pulses in the plasma from multiple plasma pulsing feeds supplied to the plasma process chamber.

19. The method of claim 1, wherein said generating measurement data comprises measuring an optical emission spectra of the plasma while measuring: (a) a power, a voltage or a current of the first power signal, (b) a power, a voltage or a current of the second power signal and/or (c) a power, a voltage or a current of a harmonic of the first power signal or the second power signal, and wherein said method further comprises comparing the optical emission spectra of the plasma to: (a) the power, voltage or current of the first power signal, (b) the power, voltage or current of the second power signal or (c) the power, the voltage or the current of the harmonic of the first power signal or the second power signal.

20. The method of claim 1, wherein said generating measurement data comprises measuring the chamber pressure within the plasma process chamber, and wherein said adjusting comprises adjusting the chamber pressure during the plasma process to control the one or more properties of the plasma.

\* \* \* \* \*